US009348226B2

(12) United States Patent
Nishimura et al.

(10) Patent No.: US 9,348,226 B2
(45) Date of Patent: *May 24, 2016

(54) RADIATION-SENSITIVE RESIN COMPOSITION

(75) Inventors: Isao Nishimura, Tokyo (JP); Kouichi Fujiwara, Tokyo (JP); Eiichi Kobayashi, Tokyo (JP); Tsutomu Shimokawa, Tokyo (JP); Atsushi Nakamura, Tokyo (JP); Eiji Yoneda, Tokyo (JP); Yong Wang, Tokyo (JP)

(73) Assignee: JSR CORPORATION, Tokyo (JP)

( * ) Notice: Subject to any disclaimer, the term of this patent is extended or adjusted under 35 U.S.C. 154(b) by 1108 days.

This patent is subject to a terminal disclaimer.

(21) Appl. No.: 10/541,032

(22) PCT Filed: Dec. 24, 2003

(86) PCT No.: PCT/JP03/16640
§ 371 (c)(1),
(2), (4) Date: Apr. 21, 2006

(87) PCT Pub. No.: WO2004/061525
PCT Pub. Date: Jul. 22, 2004

(65) Prior Publication Data
US 2006/0234154 A1 Oct. 19, 2006

(30) Foreign Application Priority Data

Dec. 28, 2002 (JP) .................................. 2002-383840

(51) Int. Cl.
*G03F 7/039* (2006.01)
*G03F 7/004* (2006.01)
*G03F 7/20* (2006.01)

(52) U.S. Cl.
CPC .............. *G03F 7/039* (2013.01); *G03F 7/0046* (2013.01); *G03F 7/0397* (2013.01); *G03F 7/2006* (2013.01)

(58) Field of Classification Search
USPC ...................................................... 430/270.1
See application file for complete search history.

(56) References Cited

U.S. PATENT DOCUMENTS

| 4,753,981 | A | * | 6/1988 | Clark, Jr. ....................... 524/801 |
| 6,380,335 | B1 | | 4/2002 | Charmot et al. |
| 6,416,928 | B1 | * | 7/2002 | Ohsawa et al. ............ 430/270.1 |
| 6,479,211 | B1 | * | 11/2002 | Sato et al. .................. 430/270.1 |
| 7,186,495 | B2 | | 3/2007 | Maeda |
| 7,250,475 | B2 | * | 7/2007 | Benoit et al. ................... 525/259 |
| 7,510,817 | B2 | * | 3/2009 | Benoit et al. ............... 430/270.1 |
| 2001/0026901 | A1 | * | 10/2001 | Maeda et al. .............. 430/270.1 |
| 2002/0051936 | A1 | | 5/2002 | Harada et al. |
| 2003/0077543 | A1 | | 4/2003 | Sato |
| 2003/0134225 | A1 | * | 7/2003 | Fujimori et al. ........... 430/270.1 |
| 2004/0063024 | A1 | * | 4/2004 | Khojasteh et al. ......... 430/270.1 |

FOREIGN PATENT DOCUMENTS

| EP | 1184723 A2 * | 3/2002 |
| EP | 1 267 210 A2 | 12/2002 |
| JP | 05-188598 | 7/1993 |
| JP | 06-012452 | 1/1994 |
| JP | 2000026535 | 1/2000 |
| JP | 2000-119307 | 4/2000 |
| JP | 2000119307 | 4/2000 |
| JP | 2000159758 | 6/2000 |
| JP | 2000-264914 | 9/2000 |
| JP | 2001151824 | 6/2001 |
| JP | 2001-261733 | 9/2001 |
| JP | 2001296661 A | 10/2001 |
| JP | 2002-003533 | 1/2002 |
| JP | 2002003533 | 1/2002 |
| JP | 2002-080523 | 3/2002 |
| JP | 2002080523 | 3/2002 |
| JP | 2002-145955 | 5/2002 |
| JP | 2002-145972 | 5/2002 |
| JP | 2002-155118 | 5/2002 |
| JP | 2002-156750 | 5/2002 |
| JP | 2002131914 A | 5/2002 |
| JP | 2002146000 A | 5/2002 |
| JP | 2002155118 | 5/2002 |
| JP | 2002155118 A * | 5/2002 |
| JP | 2002-201232 | 7/2002 |
| JP | 2002526610 A | 8/2002 |
| JP | 2002-251009 | 9/2002 |
| JP | 2002251009 | 9/2002 |
| JP | 2002278070 A | 9/2002 |
| JP | 2003-084436 | 3/2003 |

(Continued)

OTHER PUBLICATIONS

Gennady et al., "Decomposition of Model Alkoxyamines in Simple and Polymerizing Systems. I. 2,2,6,6-Tetramethylpiperidinyl-N-oxyl-Based Compounds," Physikalisch-Chemisches Institut, Universitaet Zuerich, pp. 3604-3611, Jul. 2001.*
Bradford B. Wayland et al., "Living Radical Polymerization of Acrylates by Organocobalt Porphyrin Complexes," J. Am. Chem. Soc., 1994, 116, 7943-7944.
Michael K. Georges et al., "Narrow Polydispersity Polystyrene by a Free-Radical Polymerization Process-Rate Enhancement," Macromolecules, 1994, 27, 7228-72296.
Craig J. Hawker et al., "Accurate Control of Chain Ends by a Novel "Living" Free-Radical Polymerization Process," Macromolecules, 1995, 28, 2993-2995.

(Continued)

*Primary Examiner* — Cynthia Hamilton
(74) *Attorney, Agent, or Firm* — Morris, Manning & Martin, LLP; Christopher W. Raimund

(57) ABSTRACT

A radiation-sensitive resin composition comprising an acid-labile group-containing resin obtained by living radical polymerization having a specific structure which is insoluble or scarcely soluble in alkali, but becomes alkali soluble by the action of an acid, and a photoacid generator, wherein the ratio of weight average molecular weight to number average molecular weight (weight average molecular weight/number average molecular weight) of the acid-labile group-containing resin is smaller than 1.5.

14 Claims, No Drawings

(56) References Cited

FOREIGN PATENT DOCUMENTS

| | | |
|---|---|---|
| JP | 2003084436 | 3/2003 |
| JP | 2003-238629 | 8/2003 |
| JP | 2003238629 | 8/2003 |
| JP | 2003-322972 | 11/2003 |
| JP | 2003322972 | 11/2003 |
| KR | 1020010053380 | 6/2001 |
| KR | 10-0320097 | 10/2002 |
| WO | 95/10552 | 4/1995 |
| WO | WO 9510552 * | 4/1995 |
| WO | WO 9630421 A1 * | 10/1996 |
| WO | 98/01478 | 1/1998 |
| WO | 9801478 | 1/1998 |
| WO | WO 9801478 A1 * | 1/1998 |
| WO | 98/58974 | 12/1998 |
| WO | 99/31144 | 6/1999 |
| WO | 99/35177 | 7/1999 |
| WO | 00/20469 A1 | 4/2000 |
| WO | 02/090397 | 11/2002 |
| WO | WO-2005-003198 A1 * | 6/2004 |

OTHER PUBLICATIONS

Chemical Handbook, Basic Chemistry, 4$^{th}$ Ed (1993) by the Chemical Society of Japan.

* cited by examiner

RADIATION-SENSITIVE RESIN COMPOSITION

TECHNICAL FIELD

The present invention relates to a radiation-sensitive resin composition and, particularly, to a radiation-sensitive resin composition suitable as a chemically-amplified resist useful for microfabrication utilizing various types of radiation, for example, deep ultraviolet rays such as a KrF excimer laser or ArF excimer laser, X-rays such as synchrotron radiation, or charged particle rays such as electron beams.

BACKGROUND ART

In the field of microfabrication represented by the manufacture of integrated circuit devices, lithographic technology enabling microfabrication with a line width of about 200 nm or less using an ArF excimer laser (wavelength: 193 nm), $F_2$ excimer laser (wavelength: 157 nm), and the like has been demanded in order to achieve higher integration in recent years. As a radiation-sensitive resin composition applicable to the excimer laser radiation, a number of chemically-amplified radiation-sensitive compositions utilizing a chemical amplification effect between a component having an acid-labile functional group and an acid generator, a component generating an acid upon irradiation, have been proposed.

For example, a chemically-amplified positive-tone resist composition comprising a resin possessing alkali-solubility protected by a 2-alkyl-2-adamantyl group or 1-adamantyl-1-alkyladamantyl group, being insoluble or scarcely soluble in alkali by itself, but becoming alkali-soluble by the action of an acid, and a specific sulfonium salt acid generator (Japanese Patent Application Laid-open No. 2002-156750), a polymer for photoresist prepared by ternary copolymerization of a specific substrate-adhesive alicyclic ester, an acid-labile ester having a specific alicyclic skeleton, and, as a third component, a specific alicyclic ester having a polarity between the above first component and the second component (Japanese Patent Application Laid-open No. 2002-145955), a resin which contains three types of monomer units of specific structures having an alicyclic skeleton at a specific ratio (Japanese Patent Application Laid-open No. 2002-201232), and the like have been known.

However, to achieve a higher degree of integration in the field of semiconductor, a radiation-sensitive resin composition used as a resist is required to possess more excellent resolution. In producing more detailed patterns, reproducibility of raw materials that produce fluctuations in the product properties between manufacturing lots is demanded. In addition, along with the progress of microfabrication there are a number of cases in which a minor defect during development results in a fatal defect in the design of devices. As a countermeasure, in addition to the effort for increasing a process margin such as increasing resolution as a resist and radiation dose-dependency, promoting solubility of the resist in a solvent is regarded as an urgent subject of development, since minute defects produced during development are supposed to originate from the resin which is a component forming the resist.

DISCLOSURE OF THE INVENTION

The present invention has been achieved in view of this situation. Specifically, an object of the present invention is to provide a radiation-sensitive resin composition having high transparency to radiation, excelling in basic properties as a resist such as sensitivity, resolution, dry etching resistance, and pattern shape, and, in particular, excelling in solubility in a resist solvent, reducing roughness on the pattern side walls after development, and capable of increasing manufacturing stability by using a (meth)acrylic polymer having a specific molecular weight distribution.

The radiation-sensitive resin composition of the present invention comprises an acid-labile group-containing resin which is insoluble or scarcely soluble in alkali, but becomes alkali soluble by the action of an acid and a photoacid generator, wherein the acid-labile group-containing resin comprises a recurring unit of the following formula (1) and has a ratio (Mw/Mn) of a weight average molecular weight (Mw) to a number average molecular weight (Mn) of smaller than 1.5.

In the present invention, Mw and Mn are respectively polystyrene-reduced average molecular weights determined by gel-permeation chromatography (GPC).

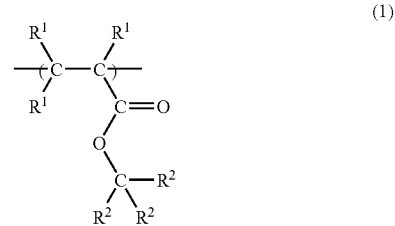

(1)

wherein $R^1$ individually represents a hydrogen atom, methyl group, trifluoromethyl group, or hydroxymethyl group and $R^2$ individually represents a monovalent alicyclic hydrocarbon group having 4-20 carbon atoms or a derivative thereof, or a linear or branched alkyl group having 1-4 carbon atoms, provided that at least one of $R^2$ groups is an alicyclic hydrocarbon group or a derivative thereof, or any two of $R^2$ groups form a divalent alicyclic hydrocarbon group having 4-20 carbon atoms or a derivative thereof in combination with the carbon atom to which the two $R^2$ groups bond, with the remaining $R^2$ group being a linear or branched alkyl group having 1-4 carbon atoms, a monovalent alicyclic hydrocarbon group having 4-20 carbon atoms or a derivative thereof.

The above acid-labile group-containing resin is a polymer produced using a living radical polymerization initiator.

In addition, the above acid-labile group-containing resin is a polymer produced by random polymerization of the recurring units which form the resin.

Investigation into the cause of minor defects in the lithography technology has revealed that the fluctuation in the molecular weight distribution of the acid-labile group-containing resin has a significant effect on fluctuation of substrate board manufacturing lots. Specifically, it was found that the molecular weight distribution must be decreased. In addition, the solubility of the resin component forming the radiation-sensitive resin composition of the resist in a solvent such as propylene glycol monomethyl ether acetate was found to be the cause of the problem. The present invention has been achieved based on these findings.

In the present invention, the ratio of Mw/Mn can be reduced to less than 1.5 by using a living radical polymerization initiator, whereby the fluctuation in the molecular weight distribution of the acid-labile group-containing resin can be minimized. In addition, the solubility in a solvent can be improved if the acid-labile group-containing resin is a random polymer.

As a result, as a chemically-amplified resist sensitive to active radiations, particularly deep ultraviolet rays represented by an ArF excimer laser (wavelength: 193 nm), the radiation-sensitive resin composition of the present invention not only has high transmittance of radiations and exhibits superior basic properties as a resist such as high sensitivity, resolution, dry etching resistance, and pattern configuration, but also, in the first place, has extremely high solubility in a resist solvent and, in the second place, can reduce roughness on the pattern side walls after development.

BEST MODE FOR CARRYING OUT THE INVENTION

Investigation into the cause of minor defects in the lithography technology has revealed that the fluctuation in the molecular weight distribution of the acid-labile group-containing resin has a significant effect on fluctuation of substrate board manufacturing lots. Specifically, it was found that the molecular weight distribution must be decreased. In addition, the solubility of the resin component forming the radiation-sensitive resin composition of the resist in a solvent such as propylene glycol monomethyl ether acetate was found to be the cause of the problem. The present invention has been achieved based on these findings.

As preferable examples of the monomer providing the recurring unit represented by the formula (1), (meth)acrylic acid esters shown by the formula (1-1) can be given.

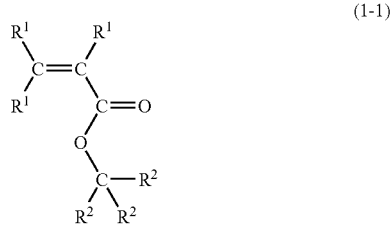

(1-1)

wherein $R^1$ and $R^2$ are the same as defined for the above formula (1).

As the monovalent alicyclic hydrocarbon group having 4-20 carbon atoms or a derivative thereof represented by $R^2$, as the alicyclic hydrocarbon group or a derivative thereof represented by at least one $R^2$, or as the divalent alicyclic hydrocarbon group having 4-20 carbon atoms formed by any two $R^2$ groups together with the carbon atoms to which the two $R^2$ groups bond or a derivative thereof, alicyclic groups derived from cycloalkanes such as bicyclo[2.2.1]heptane, tricyclo[5.2.1.0$^{2,6}$]decane, tetracyclo[6.2,1.1$^{3,6}$.0$^{2,7}$]dodecane, adamantane, cyclopentane, and cyclohexane; groups in which the alicyclic groups are substituted with at least one linear, branched, or cyclic alkyl group having 1-4 carbon atoms such as a methyl group, ethyl group, n-propyl group, i-propyl group, n-butyl group, 2-methylpropyl group, 1-methylpropyl group, and t-butyl group; and the like can be given.

As examples of the derivatives of the monovalent or divalent alicyclic hydrocarbon groups represented by $R^2$, groups having one or more substituents such as a hydroxyl group; a carboxyl group; an oxy group (=O); a hydroxyalkyl group having 1-4 carbon atoms such as a hydroxymethyl group, 1-hydroxyethyl group, 2-hydroxyethyl group, 1-hydroxypropyl group, 2-hydroxypropyl group, 3-hydroxypropyl group, 2-hydroxybutyl group, 3-hydroxybutyl group, and 4-hydroxybutyl group; an alkoxyl group having 1-4 carbon atoms such as a methoxy group, ethoxy group, n-propoxy group, i-propoxy group, n-butoxy group, 2-methylpropoxy group, 1-methylpropoxy group, and t-butoxy group; a cyano group; a cyanoalkyl group having 2-5 carbon atoms such as a cyanomethyl group, 2-cyanomethyl group, 3-cyanopropyl group, and 4-cyanobutyl group; and the like can be given. Of these substituents, a hydroxyl group, carboxyl group, hydroxymethyl group, cyano group, cyanomethyl group, and the like are preferable.

As examples of the linear or branched alkyl group having 1-4 carbon atoms represented by $R^2$, a methyl group, ethyl group, n-propyl group, i-propyl group, n-butyl group, 2-methylpropyl group, 1-methylpropyl group, and t-butyl group can be given. Of these, a methyl group, ethyl group, n-propyl group, and i-propyl group are preferable.

As preferable examples of functional group side chain forming —C($R^2$)$_3$ in the formula (1), 1-methyl-1-cyclopentyl group, 1-ethyl-1-cyclopentyl group, 1-methyl-1-cyclohexyl group, 1-ethyl-1-cyclohexyl group, 2-methyladamantan-2-yl group, 2-methyl-3-hydroxyadamantan-2-yl group, 2-ethyladamantan-2-yl group, 2-ethyl-3-hydroxyadamantan-2-yl group, 2-n-propyladamantan-2-yl group, 2-n-propyl-3-hydroxyamantan-2-yl group, 2-isopropyladamantan-2-yl group, 2-isopropyl-3-hydroxyadamantan-2-yl group, 2-methylbicyclo[2.2.1]hept-2-yl group, 2-ethylbicyclo[2.2.1]hept-2-yl group, 8-methyltricyclo[5.2.1.0$^{2,6}$]dec-8-yl group, 8-ethyltricyclo[5.2.1.0$^{2,6}$]dec-8-yl group, 4-methyltetracyclo[6.2.1.1$^{3,6}$.0$^{2,7}$]dodec-4-yl group, 4-ethyltetracyclo[6.2.1.1$^{3,6}$.0$^{2,7}$]dodec-4-yl group, 1-(bicyclo[2.2.1]hept-2-yl)-1-methylethyl group, 1-(tricyclo[5.2.1.0$^{2,6}$]dec-8-yl)-1-methylethyl group, 1-(tetracyclo[6.2.1.1$^{3,6}$.0$^{2,7}$]dodec-4-yl)-1-methylethyl group, 1-(adamantan-1-yl)-1-methylethyl group, 1-(3-hydroxyadamantan-1-yl)-1-methylethyl group, 1,1-dicyclohexylethyl group, 1,1-di(bicyclo[2.2.1]hept-2-yl) ethyl group, 1,1-di(tricyclo[5.2.1.0$^{2,6}$]dec-8-yl)ethyl group, 1,1-di(tetracyclo[6.2.1.1$^{3,6}$.0$^{2,7}$]dodec-4-yl)ethyl group, 1,1-di(adamantan-1-yl)ethyl group, and the like can be given.

The following compounds can be given as preferable examples of monomers providing the recurring unit represented by the formula (1-1): 1-methyl-1-cyclopentyl(meth)acrylate, 1-ethyl-1-cyclopentyl(meth)acrylate, 1-methyl-1-cyclohexyl(meth)acrylate, 1-ethyl-1-cyclohexyl(meth)acrylate, 2-methyladamantan-2-yl(meth)acrylate, 2-methyl-3-hydroxyadamantan-2-yl(meth)acrylate, 2-ethyladamantan-2-yl(meth)acrylate, 2-ethyl-3-hydroxyadamantan-2-yl(meth)acrylate, 2-n-propyladamantan-2-yl(meth)acrylate, 2-n-propyl-3-hydroxyadamantan-2-yl(meth)acrylate, 2-isopropyladamantan-2-yl(meth)acrylate, 2-isopropyl-3-hydroxyadamantan-2-yl(meth)acrylate, 2-methylbicyclo[2.2.1]hept-2-yl(meth)acrylate, 2-ethylbicyclo[2.2.1]hept-2-yl(meth)acrylate, 8-methyltricyclo[5.2.1.0$^{2,6}$]dec-8-yl(meth)acrylate, 8-ethyltricyclo[5.2.1.0$^{2,6}$]dec-8-yl(meth)acrylate, 4-methyltetracyclo[6.2.1.1$^{3,6}$.0$^{2,7}$]dodec-4-yl(meth)acrylate, 4-ethyltetracyclo[6.2.1.1$^{3,6}$.0$^{2,7}$]dodec-4-yl(meth)acrylate, 1-(bicyclo[2.2.1]hept-2-yl)-1-methyl(meth)acrylate, 1-(tricyclo[5.2.1.0$^{2,6}$]dec-8-yl)-1-methyl(meth)acrylate, 1-(tetracyclo[6.2.1.1$^{3,6}$.0$^{2,7}$]dodec-4-yl)-1-methylethyl(meth)acrylate, 1-(adamantan-1-yl)-1-methylethyl(meth)acrylate, 1-(3-hydroxyadamantan-1-yl)-1-methylethyl(meth)acrylate, 1,1-dicyclohexylethyl(meth)acrylate, 1,1-di(bicyclo[2.2.1]hept-2-yl)ethyl(meth)acrylate, 1,1-di(tricyclo[5.2.1.0$^{2,6}$]dec-8-yl)ethyl(meth)acrylate, 1,1-di(tetracyclo[6.2.1.1$^{3,6}$.0$^{2,7}$]dodec-4-yl)ethyl(meth)acrylate, 1,1-di(adamantan-1-yl)ethyl(meth)acrylate, and the like.

Among the monomers providing the recurring unit represented by the above formula (1-1), particularly preferable monomers are 1-methyl-1-cyclopentyl(meth)acrylate, 1-ethyl-1-cyclopentyl(meth)acrylate, 1-methyl-1-cyclohexyl (meth)acrylate, 1-ethyl-1-cyclohexyl(meth)acrylate, 2-methyladamantan-2-yl(meth)acrylate, 2-ethyladamantan-2-yl (meth)acrylate, 2-n-propyladamantan-2-yl(meth)acrylate, 2-isopropyladamantan-2-yl(meth)acrylate, and 1-(adamantan-1-yl)-1-methylethyl(meth)acrylate. These monomers may be used either individually or in combination of two or more.

The acid-labile group-containing resin having the ratio of Mw/Mn smaller than 1.5 preferably comprises, in addition to the recurring unit of the formula (1), at least one of the recurring units of the following formulas (2) to (7).

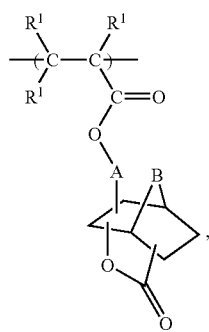
(2)

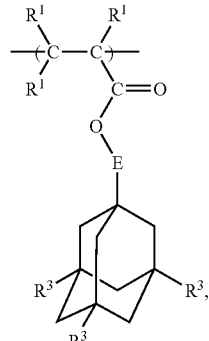
(3)

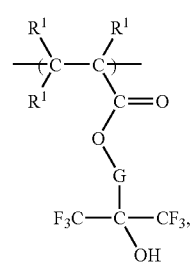
(4)

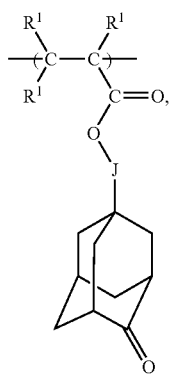
(5)

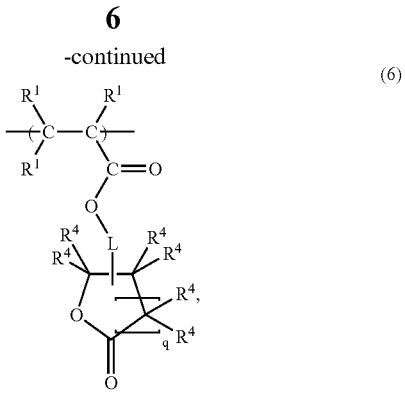
(6)

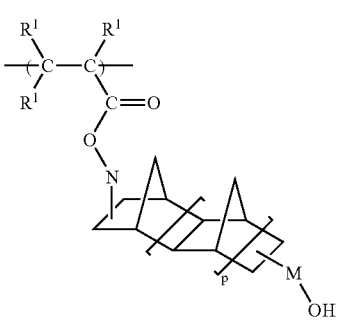
(7)

In the formulas (2) to (7), $R^1$ is the same as defined for the above formula (1).

In the formula (2), A indicates a single bond or a linear or branched alkylene group, mono- or dialkylene glycol group, or alkylene ester group which may have a substituent having 1-6 carbon atoms, and B represents a single bond or an alkylene group or alkyloxy group which may have a substituent having 1-3 carbon atoms, or an oxygen atom.

In the formula (3), E indicates a single bond or a divalent alkyl group having 1-3 carbon atoms, $R^3$ individually represents a hydroxyl group, a cyano group, a carboxyl group, —COOR$^5$, or —Y—R$^6$, wherein $R^5$ represents a hydrogen atom, a linear or a branched alkyl group having 1-4 carbon atoms, or an alicyclic alkyl group having 3-20 carbon atoms, Y individually represents a single bond or a divalent alkylene group having 1-3 carbon atoms, and $R^6$ individually represents a hydrogen atom, hydroxyl group, cyano group, or —COOR$^7$, provided that at least one $R^3$ group is not a hydrogen atom. A single bond, a methylene group, an ethylene group, and a propylene group can be given as E and Y.

$R^7$ in the —COOR$^7$ group represents a hydrogen atom, a linear or branched alkyl group having 1-4 carbon atoms, or an alicyclic alkyl group having 3-20 carbon atoms. As examples of the linear or branched alkyl group having 1-4 carbon atoms, a methyl group, ethyl group, n-propyl group, i-propyl group, n-butyl group, 2-methylpropyl group, 1-methylpropyl group, and t-butyl group can be given. As examples of the alicyclic alkyl group having 3-20 carbon atoms, a cycloalkyl group represented by —C$_n$H$_{2n-1}$ (wherein n is an integer of 3-20) such as a cyclopropyl group, cyclobutyl group, cyclopentyl group, cyclohexyl group, cycloheptyl group, and cyclooctyl group, polycyclic alkyl group such as a bicyclo [2.2.1]heptyl group, tricyclo[5.2.1.0$^{2,6}$]decyl group, tetracyclo[6.2.1.1$^{3,6}$.0$^{2,7}$]dodecanyl group, and adamantly group, a group in which the cycloalkyl group or polycyclic alkyl group is substituted with one or more linear, branched, or cyclic alkyl groups, and the like can be given.

In the formula (4), G represents a single bond, a linear or branched alkylene group having 1-6 carbon atoms, a divalent alicyclic hydrocarbon group having 4-20 carbon atoms, an alkylene glycol group, or an alkylene ester group. As examples of the linear or branched alkylene groups having 1-6 carbon atoms, a methylene group, ethylene group, propylene group, butylene group, pentylene group, hexylene group, and cyclohexylene group can be given.

In the formula (5), J represents a single bond, a substituted or unsubstituted, linear, branched, or cyclic alkylene group having 1-20 carbon atoms, an alkylene glycol group, or an alkylene ester group.

In the formula (6), L indicates a single bond or a substituted or unsubstituted, linear, branched, or cyclic alkylene group having 1-20 carbon atoms, an alkylene glycol group, or an alkylene ester group, and $R^4$ represents a hydrogen atom, a linear or branched alkyl, alkoxyl, or hydroxyalkyl group having 1-4 carbon atoms, or a divalent alicyclic hydrocarbon group having 3-20 carbon atoms, or a derivative of these groups. q is 1 or 2.

In the formula (7), M and N individually represent a single bond, a substituted or unsubstituted, linear, branched, or cyclic alkylene group having 1-20 carbon atoms, an alkylene glycol group, or an alkylene ester group. As examples of the linear or branched alkylene groups, a methylene group, ethylene group, propylene group, butylene group, pentylene group, hexylene group, and cyclohexylene group can be given. p is 0 or 1.

As preferable examples of the monomer providing the recurring unit represented by the formula (2), compounds shown by the formula (2-1) can be given.

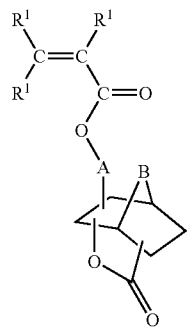

(2-1)

wherein $R^1$ represents a hydrogen atom or methyl group, and A and B are respectively the same as those defined in the above formula (2). As examples of the linear or branched alkylene groups having 1-6 carbon atoms represented by A, a methylene group, ethylene group, propylene group, butylene group, pentylene group, hexylene group, and cyclohexylene group can be given.

As preferable examples of the monomers shown by the formula (2-1), monomers shown by the following formulas (2-1-1) to (2-1-7) can be given.

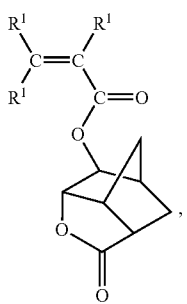

(2-1-1)

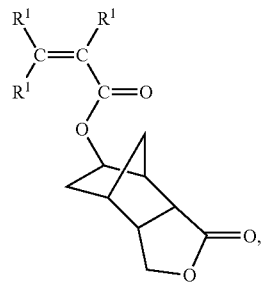

(2-1-2)

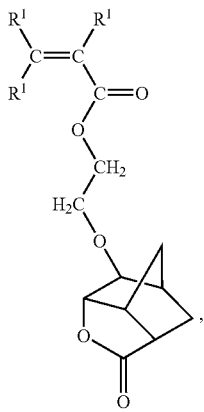

(2-1-3)

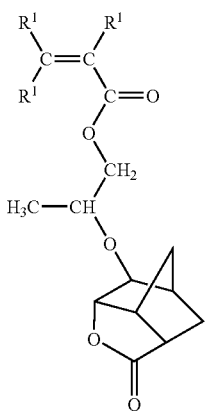

(2-1-4)

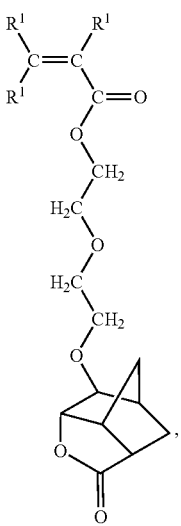

(2-1-5)

(2-1-6)

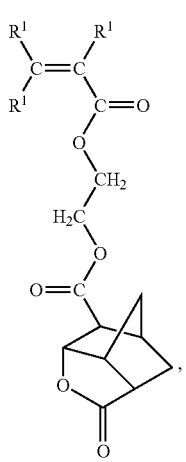

(2-1-7)

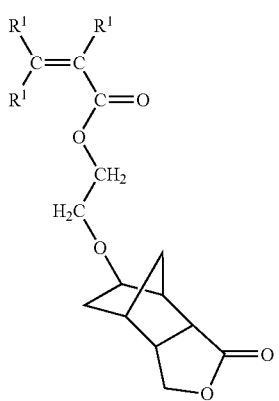

In the above formulas, $R^1$ is a hydrogen atom, a methyl group, a trifluoromethyl group, or a hydroxymethyl group and monomers having an oxygen atom instead of the above methylene group at the 7 position of norbornane skeleton can be given as preferable monomers.

As preferable examples of the monomer providing the recurring unit represented by the formula (3), compounds shown by the formula (3-1) can be given.

(3-1)

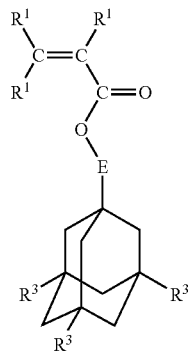

wherein $R^1$ represents a hydrogen atom or methyl group, and E and $R^3$ are respectively the same as those defined in the above formula (3).

The following monomers are preferable examples of the monomers among the monomers shown by the formula (3-1): 3-hydroxyadamantan(meth)acrylate, 3-hydroxyadamantan-1-ylmethyl(meth)acrylate, 3,5-dihydroxyadamantan-1-ylmethyl(meth)acrylate, 3-hydroxy-5-cyanoadamantan-1-ylmethyl(meth)acrylate, 3-hydroxy-5-carboxyadamantan-1-ylmethyl(meth)acrylate, 3-hydroxy-5-methoxycarbonyladamantan-1-ylmethyl(meth)acrylate, 3-hydroxymethyladamantan-1-ylmethyl(meth)acrylate, 3,5-dihydroxymethyladamantan-1-ylmethyl(meth)acrylate, 3-hydroxy-5-hydroxymethyladamantan-1-ylmethyl(meth)acrylate, 3-cyano-5-hydroxymethyladamantan-1-ylmethyl(meth)acrylate, 3-hydroxymethyl-5-carboxyadamantan-1-ylmethyl(meth)acrylate, 3-hydroxymethyl-5-methoxycarbonyladamantan-1-ylmethyl(meth)acrylate, 3-cyanoadamantan-1-ylmethyl(meth)acrylate, 3,5-dicyanoadamantan-1-ylmethyl(meth)acrylate, 3-cyano-5-carboxyadamantan-1-ylmethyl(meth)acrylate, 3-cyano-5-methoxycarbonyladamantan-1-ylmethyl(meth)acrylate, 3-carboxyadamantan-1-ylmethyl(meth)acrylate, 3,5-dicarboxyadamantan-1-ylmethyl(meth)acrylate, 3-carboxy-5-methoxycarbonyladamantan-1-ylmethyl(meth)acrylate, 3-methoxycarbonyladamantan-1-ylmethyl(meth)acrylate, 3,5-dimethoxycarbonyladamantan-1-ylmethyl(meth)acrylate, 3-hydroxy-5-methyladamantan-1-yl(meth)acrylate, 3,5-dihydroxy-7-methyladamantan-1-yl(meth)acrylate, 3-hydroxy-5-cyano-7-methyladamantan-1-yl(meth)acrylate, 3-hydroxy-5-carboxy-7-methyladamantan-1-yl(meth)acrylate, 3-hydroxy-5-methoxycarbonyl-7-methyladamantan-1-yl(meth)acrylate, 3-hydroxymethyl-5-methyladamantan-1-yl(meth)acrylate, 3,5-dihydroxymethyl-7-methyladamantan-1-yl(meth)acrylate, 3-hydroxy-5-hydroxymethyl-7-methyladamantan-1-yl(meth)acrylate, 3-cyano-5-hydroxymethyl-7-methyladamantan-1-yl(meth)acrylate, 3-hydroxymethyl-5-carboxy-7-methyladamantan-1-yl(meth)acrylate, 3-hydroxymethyl-5-methoxycarbonyl-7-methyladamantan-1-yl(meth)acrylate, 3-cyano-5-methyladamantan-1-yl(meth)acrylate, 3,5-dicyano-7-methyladamantan-1-yl(meth)acrylate, 3-cyano-5-carboxy-7-methyladamantan-1-yl(meth)acrylate, 3-cyano-5-methoxycarbonyl-7-methyladamantan-1-yl(meth)acrylate, 3-carboxy-5-methyladamantan-1-yl(meth)acrylate, 3,5-dicarboxy-7-methyladamantan-1-yl(meth)acrylate, 3-carboxy-5-methoxycarbonyl-7-methyladamantan-1-yl(meth)acrylate, 3-methoxycarbonyl-5-methyladamantan-1-yl(meth)acrylate, 3,5-dimethoxycarbonyl-7-methyladamantan-1-yl(meth)acrylate, 3-hydroxy-5-methyladamantan-1-ylmethyl(meth)acrylate, 3,5-dihydroxy-7-methyladamantan-1-ylmethyl(meth)acrylate, 3-hydroxy-5-cyano-7-methyladamantan-1-ylmethyl(meth)acrylate, 3-hydroxy-5-carboxy-7-methyladamantan-1-ylmethyl(meth)acrylate, 3-hydroxy-5-methoxycarbonyl-7-methyladamantan-1-ylmethyl(meth)acrylate, 3-hydroxymethyl-5-methyladamantan-1-ylmethyl(meth)acrylate, 3,5-dihydroxymethyl-7-methyladamantan-1-ylmethyl(meth)acrylate, 3-hydroxy-5-hydroxymethyl-7-methyladamantan-1-ylmethyl(meth)acrylate, 3-cyano-5-hydroxymethyl-7-methyladamantan-1-ylmethyl(meth)acrylate, 3-hydroxymethyl-5-carboxy-7-methyladamantan-1-ylmethyl(meth)acrylate, 3-hydroxymethyl-5-methoxycarbonyl-7-methyladamantan-1-ylmethyl(meth)acrylate, 3-cyano-5-methyladamantan-1-ylmethyl(meth)acrylate, 3,5-dicyano-7-methyladamantan-1-ylmethyl(meth)acrylate, 3-cyano-5-carboxy-7-methyladamantan-1-ylmethyl(meth)acrylate, 3-cyano-5-methoxycarbonyl-7-methyladamantan-1-ylmethyl(meth)acrylate, 3-carboxy-5-methyladamantan-1-ylmethyl(meth)acrylate, 3,5-dicarboxy-7-methyladamantan-1-ylmethyl(meth)acrylate, 3-carboxy-5-methoxycarbonyl-7-methyladamantan-1-ylmethyl(meth)acrylate, 3-methoxycarbonyl-5-methyladamantan-1- ylmethyl(meth)acrylate, 3,5-dimethoxycarbonyl-7-methyladamantan-1-ylmethyl(meth)acrylate, 3-hydroxy-5,7-dimethyladamantan-1-yl(meth)acrylate, 3-hydroxymethyl-5,7-dimethyladamantan-1-yl(meth)acrylate, 3-cyano-5,7-dimethyladamantan-1-yl(meth)acrylate, 3-carboxy-5,7-dimethyladamantan-1-yl(meth)acrylate, 3-methoxycarbonyl-5,7-dimethyladamantan-1-yl(meth)acrylate, 3-hydroxy-5,7-dimethyladamantan-1-ylmethyl(meth)acrylate, 3-hydroxymethyl-5,7-dimethyladamantan-1-ylmethyl(meth)acrylate, 3-cyano-5,7-dimethyladamantan-1-ylmethyl(meth)acrylate, 3-carboxy-5,7-dimethyladamantan-1-ylmethyl(meth)acrylate, 3-methoxycarbonyl-5,7-dimethyladamantan-1-ylmethyl(meth)acrylate, and the like.

The following monomers are preferable examples of the monomers among the monomers shown by the formula (3-1): 3-hydroxyadamantan-1-yl(meth)acrylate, 3-hydroxyadamantan-1-ylmethyl(meth)acrylate, 3,5-dihydroxyadamantan-1-ylmethyl(meth)acrylate, 3-cyanoadamantan-1-ylmethyl(meth)acrylate, 3-carboxyadamantan-1-ylmethyl(meth)acrylate, 3-hydroxy-5-methyladamantan-1-yl(meth)acrylate, 3,5-dihydroxy-7-methyladamantan-1-yl(meth)acrylate, 3-hydroxy-5,7-dimethyladamantan-1-yl(meth)acrylate, 3-carboxy-5,7-dimethyladamantan-1-yl(meth)acrylate, 3-hydroxy-5,7-dimethyladamantan-1-ylmethyl(meth)acrylate, and the like.

As preferable examples of the monomer providing the recurring unit represented by the formula (4), compounds shown by the formula (4-1) can be given.

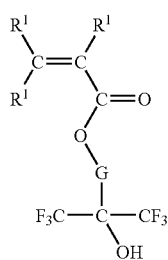

(4-1)

wherein $R^1$ represents a hydrogen atom, methyl group, trifluoromethyl group, or hydroxymethyl group and G is the same as defined in the formula (4).

As particularly preferable examples of the monomers shown by the formula (4-1), monomers shown by the following formulas (4-1-1) to (4-1-8) can be given.

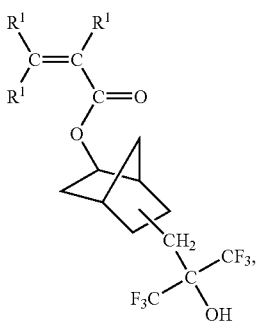

(4-1-1)

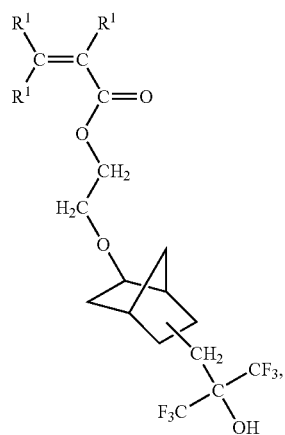

(4-1-2)

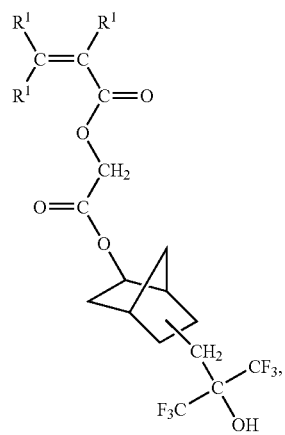

(4-1-3)

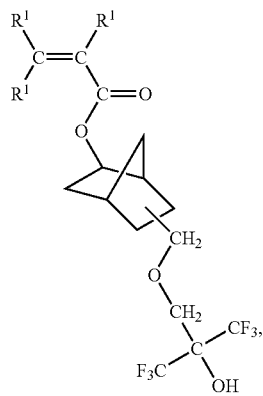

(4-1-4)

(5-1), monomers shown by the following formulas (5-1-1) to (5-1-4) can be given.

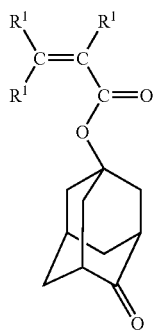
(5-1-1)

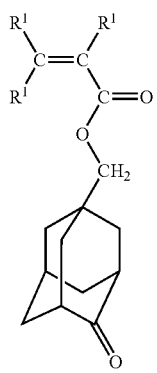
(5-1-2)

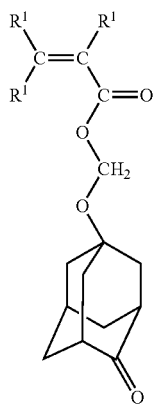
(5-1-3)

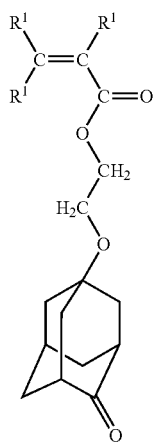
(5-1-4)

In the above formulas, $R^1$ represents a hydrogen atom, methyl group, trifluoromethyl group, or hydroxymethyl group.

As preferable examples of the monomer providing the recurring unit represented by the formula (6), compounds shown by the formula (6-1) can be given.

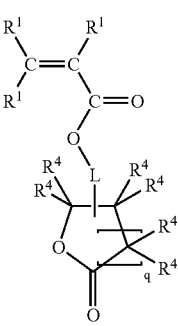
(6-1)

wherein $R^1$ represents a hydrogen atom, methyl group, trifluoromethyl group, or hydroxymethyl group and q, L, and $R^4$ are the same as those defined in the formula (6).

As particularly preferable examples of the monomers shown by the formula (6-1), monomers shown by the following formulas (6-1-1) to (6-1-15) can be given.

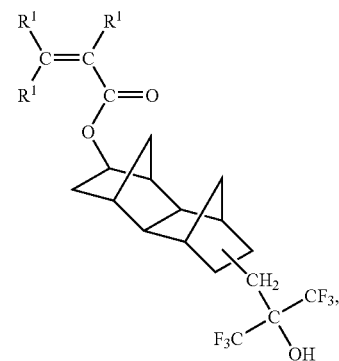
(4-1-5)

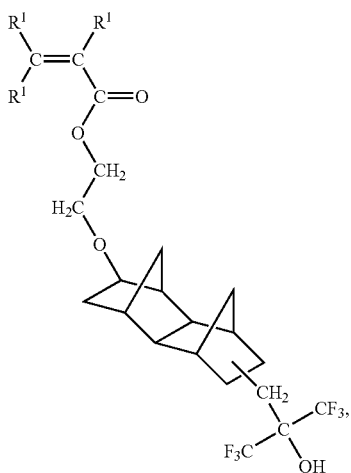
(4-1-6)

-continued (4-1-7)
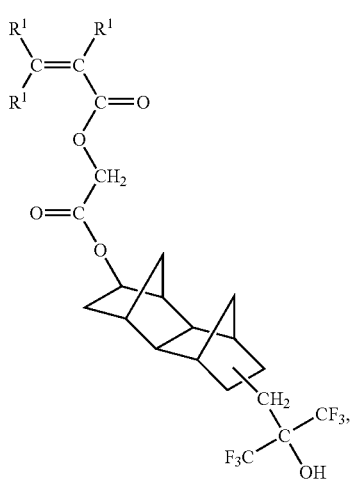

(4-1-8)
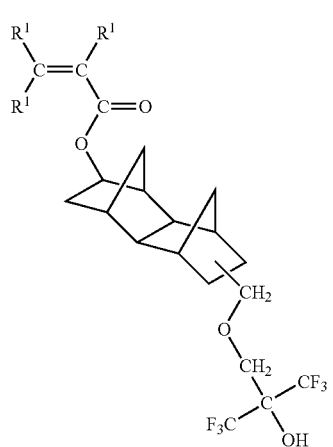

In the above formulas, $R^1$ is a hydrogen atom, a methyl group, a trifluoromethyl group, or a hydroxymethyl group and monomers having an oxygen atom instead of the above methylene group at the 7 position of the norbornane skeleton can be given as preferable monomers.

As preferable examples of the monomer providing the recurring unit represented by the formula (5), compounds shown by the formula (5-1) can be given.

(5-1)
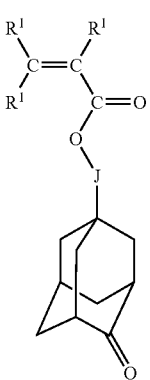

wherein $R^1$ represents a hydrogen atom or methyl group, and J is the same as that defined in the above formula (5).

As particularly preferable examples of the monomers shown by the formula (6-1-1)
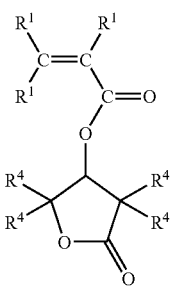

(6-1-2)
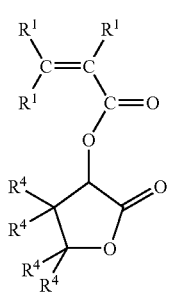

(6-1-3)
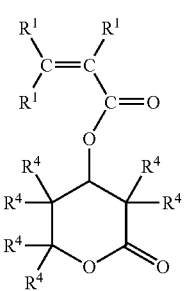

(6-1-4)
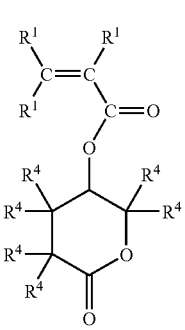

(6-1-5)
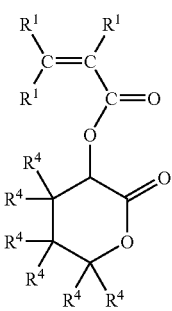

(6-1-6) 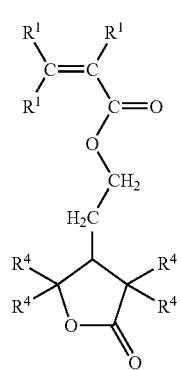
(6-1-7) 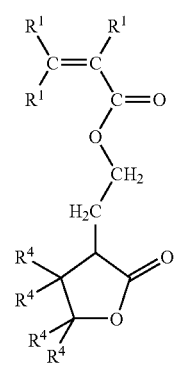
(6-1-8) 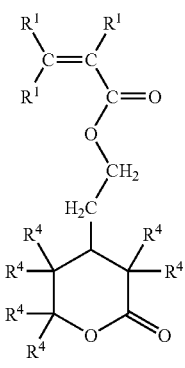
(6-1-9) 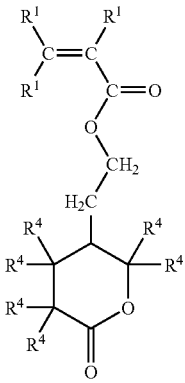
(6-1-10) 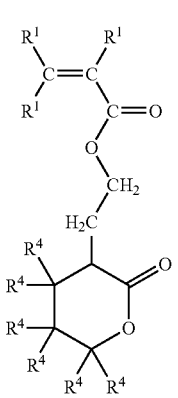
(6-1-11) 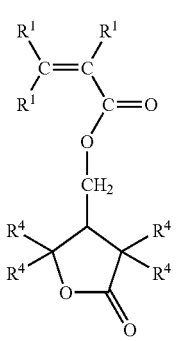
(6-1-12) 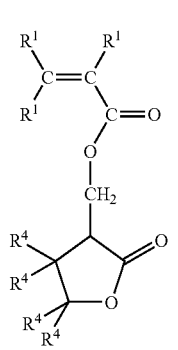
(6-1-13) 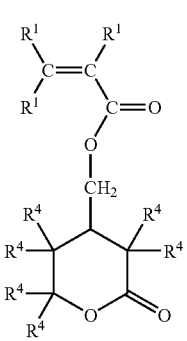

-continued

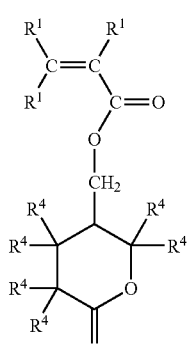
(6-1-14)

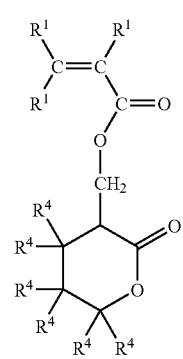
(6-1-15)

As preferable examples for $R^4$ in the formulas, a hydrogen atom, methyl group, ethyl group, propyl group, butyl group, cyclohexyl group, norbornyl group, adamantyl group, methoxy group, ethoxy group, propoxy group, butoxy group, hydroxymethyl group, and hydroxyethyl group can be given.

As preferable examples of the monomer providing the recurring unit represented by the formula (7), compounds shown by the formula (7-1) can be given.

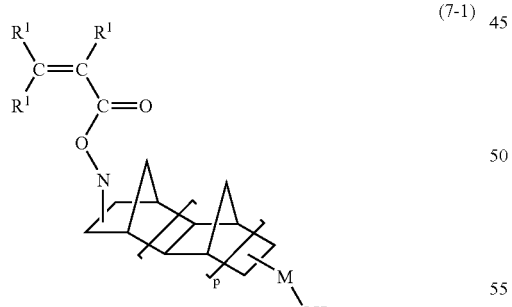
(7-1)

wherein $R^1$ represents a hydrogen atom, methyl group, trifluoromethyl group, or hydroxymethyl group and M, N, and p are the same as those defined in the formula (7).

As particularly preferable examples of the monomers shown by the formula (7-1), monomers shown by the following formulas (7-1-1) to (7-1-9) can be given.

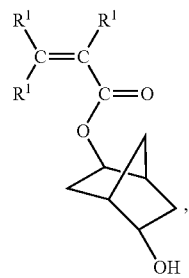
(7-1-1)

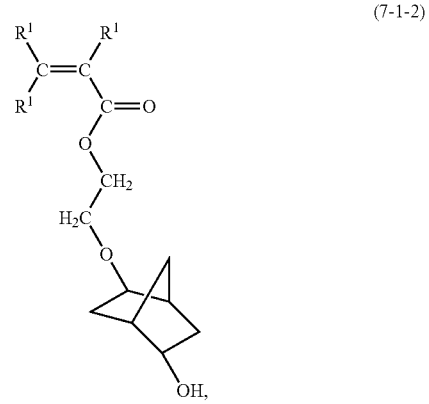
(7-1-2)

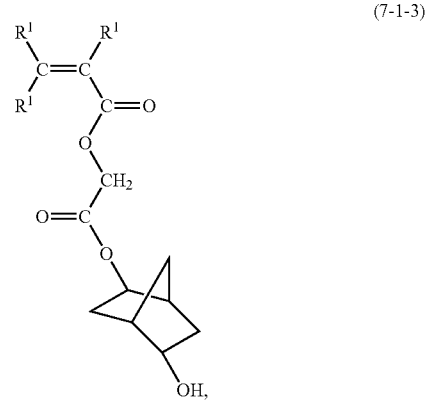
(7-1-3)

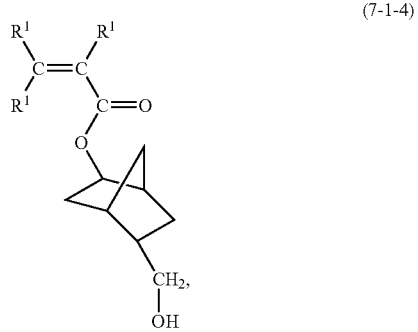
(7-1-4)

(7-1-5)

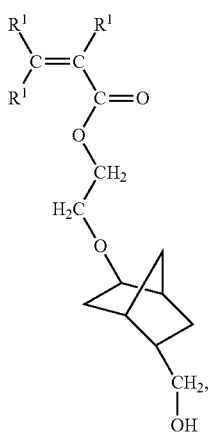

(7-1-6)

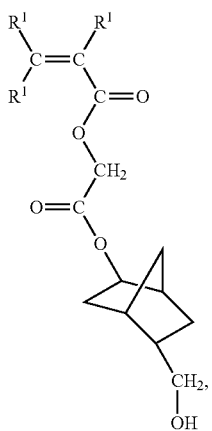

(7-1-7)

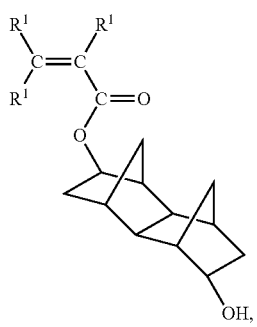

(7-1-8)

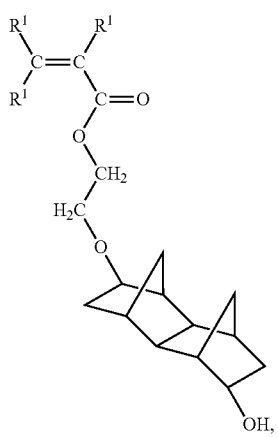

(7-1-9)

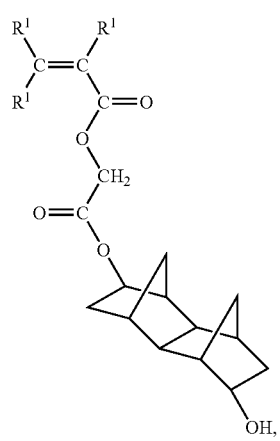

The acid-labile group-containing resin having a Mw/Mn ratio smaller than 1.5 preferably comprises other recurring units in addition to the recurring units of the formulas (1)-(7).

The following compounds can be given as examples of monomers providing such other recurring units: hydroxymethyl(meth)acrylate, 2-hydroxyethyl 1-(meth)acrylate, (meth)acrylic acid, 5(6)-hydroxybicyclo[2.2.1]hept-2-yl (meth)acrylate, 9(10)-hydroxytetracyclo[6.2.1.1$^{3,6}$.0$^{2,7}$]dodec-4-yl (meth)acrylate, carboxymethyl(meth)acrylate, 2-carboxyethyl (meth)acrylate, 3-carboxyadamantan-1-yl (meth)acrylate, 5(6)-carboxybicyclo[2.2.1]hept-2-yl (meth)acrylate, 9(10)-carboxytetracyclo[6.2.1.1$^{3,6}$.0$^{2,7}$]dodec-4-yl (meth)acrylate, cyanomethyl(meth)acrylate, 2-cyanoethyl 1-(meth)acrylate, 3-cyanoadamantan-1-yl (meth)acrylate, 5(6)-cyanobicyclo[2.2.1]hept-2-yl (meth)acrylate, 9(10)-cyanotetracyclo[6.2.1.1$^{3,6}$.0$^{2,7}$]dodec-4-yl (meth)acrylate, methyl (meth)acrylate, ethyl (meth)acrylate, adamantan-1-yl (meth)acrylate, bicyclo[2.2.1]hept-2-yl (meth)acrylate, 7,7-dimethylbicyclo[2.2.1]hept-1-yl (meth)acrylate, tricyclo[5.2.1.0$^{2,6}$]dec-8-yl (meth)acrylate; 7-oxo-6-oxabicyclo[3.2.1]oct-4-yl (meth)acrylate, 2-methoxycarbonyl-7-oxo-6-oxabicyclo[3.2.1]oct-4-yl (meth)acrylate, 2-oxotetrahydropyran-4-yl (meth)acrylate, 4-methyl-2-oxotetrahydropyran-4-yl (meth)acrylate, 5-oxotetrahydrofuran-3-yl (meth)acrylate, 2,2-dimethyl-5-oxotetrahydrofuran-3-yl (meth)acrylate, 4,4-dimethyl-5-oxotetrahydrofuran-3-yl (meth)acrylate, 2-oxotetrahydrofuran-3-yl(meth)acrylate, 4,4-dimethyl-2-oxotetrahydrofuran-3-yl (meth)acrylate, 5,5-dimethyl-2-oxotetrahydrofuran-3-yl (meth)acrylate, 5-oxotetrahydrofuran-2-yl methyl (meth)acrylate, 3,3-dimethyl-5-oxotetrahydrofuran-2-yl methyl (meth)acrylate, N,N-dimethyl(meth)acrylamide, crotonamide, maleinamide, fumaramide, mesaconamide, citraconamide, itaconamide; methylene glycol di(meth)acrylate, ethylene glycol di(meth)acrylate, 2,5-dimethyl-2,5-hexanediol di(meth)acrylate, 1,2-adamantanediol di(meth)acrylate, 1,3-adamantanediol di(meth)acrylate, 1,4-adamantanediol di(meth)acrylate, tricyclodecanyldimethylol di(meth)acrylate, and the like.

The acid-labile group-containing resin having a Mw/Mn ratio smaller than 1.5 is preferably formed from the recurring unit of the formula (1) and at least one of the recurring units of the above formulas (2) to (7).

The content of the recurring unit (1) in the copolymer is usually 15-70 mol %, and preferably 15-25 mol % of the total amount of the recurring units. If the content is less than 15 mol %, resolution as a resist may be decreased. If the content exceeds 70 mol %, developability may be decreased.

When the copolymer contains the recurring unit (2), the content of the recurring unit (2) in the copolymer is usually 5-70 mol %, and preferably 5-60 mol % of the total amount of the recurring units.

When the copolymer contains the recurring unit (3), the content of the recurring unit (3) in the copolymer is usually 5-70 mol %, and preferably 5-50 mol % of the total amount of the recurring units.

When the copolymer contains the recurring unit (4), the content of the recurring unit (4) in the copolymer is usually 5-70 mol %, and preferably 5-50 mol % of the total amount of the recurring units.

When the copolymer contains the recurring unit (5), the content of the recurring unit (5) in the copolymer is usually 5-70 mol %, and preferably 5-50 mol % of the total amount of the recurring units.

When the copolymer contains the recurring unit (6), the content of the recurring unit (6) in the copolymer is usually 5-70 mol %, and preferably 5-50 mol % of the total amount of the recurring units.

When the copolymer contains the recurring unit (7), the content of the recurring unit (7) in the copolymer is usually 5-70 mol %, and preferably 5-50 mol % of the total amount of the recurring units.

If the content of the recurring unit (2) is more than 70 mol %, the resist exhibits poor resolution and has a tendency of having an impaired solubility in a solvent. If the content of the recurring unit (3) is more than 70 mol %, the resist tends to exhibit poor developability. If the content of the recurring unit (4) is more than 70 mol %, the resist tends to exhibit poor dry etching resistance. If the content of the recurring unit (5) is more than 70 mol %, the resist tends to exhibit poor resolution. If the content of the recurring unit (6) is more than 70 mol %, the resist tends to exhibit poor developability. If the content of the recurring unit (7) is more than 70 mol %, the resist tends to exhibit poor developability.

The ratio of Mw/Mn of the acid-labile group-containing resin can be easily reduced to less than 1.5 by living radical polymerization using a living radical polymerization initiator.

The living radical polymerization used in the present invention means radical polymerization in which the activity in the polymerization terminal is maintained without being lost. In a narrow sense, living polymerization indicates the polymerization in which the terminals constantly possess activity. Generally, quasi living polymerization in which active terminals and inactivated terminals coexist in equilibrium is included in the living polymerization. This latter definition applies to the present invention. Research on the living radical polymerizations is positively undertaken by a number of research consortium in recent years. As examples, living polymerization using a chain transfer agent such as a polysulfide, living polymerization using a cobalt porphyrin complex (J. Am. Chem. Soc. 1994, 116, 7943) or a radical scavenger such as a nitroxide compound (Macromolecules, 1994, 27, 7228), atomic transfer radical polymerization using an organic halide and the like as an initiator and a transition metal complex as a catalyst (Japanese Patent Applications Laid-open No. 2002-145972, No. 2002-80523, No. 2001-261733, No. 2000-264914), living polymerization using RCSS in the growing terminals (WO 9801478 A1, WO 9858974 A1, WO 9935177 A1, WO 9931144, U.S. Pat. No. 6,380,335 B1), and the like can be given.

Methods for living radical polymerization suitable in the present invention will now be described.

Among the methods for living radical polymerization for manufacturing the acid-labile group-containing resin using a heat radical generator and a nitroxide compound as initiators, a method of using a radical scavenger in the nitroxide compound of a living radical polymerization initiator will be explained. In this polymerization, a stable nitroxy free radical (=N—O.) is used as a radical capping agent. Although not limited, as such a compound, a nitroxy free radical from a cyclic hydroxylamine such as a 2,2,6,6-substituted-1-piperidinyloxy radical, 2,2,5,5-substituted-1-pyrrolidinyloxy radical, and the like are preferable. As the substituent, alkyl groups having 4 or less carbon atoms such as a methyl group and ethyl group are suitable.

As specific examples of the nitroxy free radical compound, 2,2,6,6-tetramethyl-1-piperidinyloxy radical (TEMPO), 2,2,6,6-tetraethyl-1-piperidinyloxy radical, 2,2,6,6-tetramethyl-4-oxo-1-piperidinyloxy radical, 2,2,5,5-tetramethyl-1-pyrrolidinyloxy radical, 1,1,3,3-tetramethyl-2-isoindolinyloxy radical, N,N-di-t-butylaminoxy radical, and the like can be given. Instead of the nitroxy free radical, a stable free radical such as a galvinoxyl free radical and the like can also be used.

The radical capping agent may be used together with a heat radical generator. The reaction product of a radical capping agent and a heat radical generator is supposed to act as an initiator to proceed polymerization of addition-polymerizable monomers. Although there are no specific limitations, the molar ratio of the radical capping agent to the heat radical generating agent is 1:0.1 to 1:10.

Although various compounds can be used as the heat radical generator, peroxides and azo compounds which can generate radicals under polymerization temperature conditions are preferable. Although not specifically limited, diacylperoxides such as benzoylperoxide and lauroylperoxide; dialkylperoxides such as dicumylperoxide and di-t-butylperoxide; peroxycarbonates such as diisopropylperoxydicarbonate and bis(4-t-butylcyclohexyl)peroxydicarbonate; alkylper esters such as t-butylperoxyoctoate and t-butylperoxybenzoate; and the like can be given as the peroxide. A particularly preferable compound is benzoylperoxide. As azo compounds, 2,2'-azobisisobutyronitrile, 2,2'-azobis-(2,4-dimethylvaleronitrile), 2,2'-azobis(4-methoxy-2,4-dimethylvaleronitrile), dimethyl azobisisobutyrate, and the like can be given. Of these, dimethyl azobisisobutyrate is particularly preferable.

It is also possible to use an alkoxyamine compound of the formula (9) or (10) as an initiator instead of a heat radical generator and a radical capping agent as described in Macromolecules, 28, 2993 (1995).

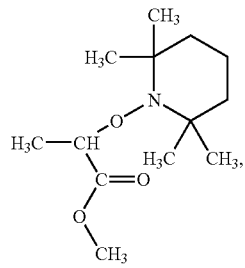

(9)

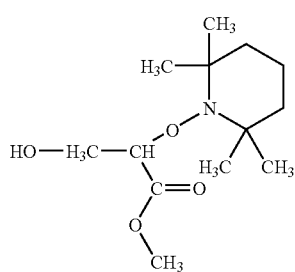

When an alkoxyamine compound having a hydroxyl group or the like as a functional group as shown in the formula (10) is used as an initiator, a polymer having a functional group at the terminal can be obtained.

The polymerization conditions such as monomers, solvents, and polymerization temperature in the polymerization using a radical scavenger such as the above-mentioned nitroxide compound are not specifically limited. The same conditions as described in connection with the following atomic transfer radical polymerization may be applied.

As a living radical polymerization initiator, an initiator comprising of a transition metal complex, an organic halide, and Lewis acid or an amine can be used.

As the central metal forming the transition metal complex, metals of the Group VII-XI in the periodic table such as iron, copper, nickel, rhodium, ruthenium, and rhenium (according to the periodic table in Chemical Handbook, Basic Chemistry, 4th Ed (1993) by the Chemical Society of Japan) are preferable. Of these, ruthenium and copper are preferable.

Specific examples of the transition metal complex having ruthenium as the central metal include dichlorotris(triphenylphosphine)ruthenium, dichlorotris(tributylphosphine) ruthenium, dichloro(cyclooctadiene)ruthenium, dichlorobenzene ruthenium, dichloro p-cymene ruthenium, dichloro(norbornadiene) ruthenium, cis-dichlorobis(2,2'-bipyridine)ruthenium, dichlorotris(1,10-phenanthroline) ruthenium, carbonylchlorohydride tris(triphenylphosphine) ruthenium, chlorocyclopentadienyl bis(triphenylphosphine) ruthenium, chloropentamethylcyclopentadienyl bis(triphenylphosphine) ruthenium, chloroindenylbis(triphenylphosphine) ruthenium, and the like.

Particularly preferable transition metal complexes are dichlorotris(triphenylphosphine) ruthenium, chloropentamethylcyclopentadienyl bis(triphenylphosphine) ruthenium, and chloroindenylbis(triphenylphosphine) ruthenium.

An organic halide functions as a polymerization initiator. As the organic halide, α-halogenocarbonyl compounds or α-halogenocarboxylates can be used. Of these, α-halogenocarboxylates are preferable. As specific examples, ethyl 2-bromo-2-methyl propanoate, 2-hydroxyethyl 2-bromopropionate, dimethyl 2-chloro-2,4,4-trimethylglutarate, and the like can be given.

Lewis acid or an amine functions as an activator. As the Lewis acid, aluminum trialkoxides such as aluminum triisopropoxide and aluminum tri(t-butoxide); bis(substituted aryloxy)alkylaluminium such as bis(2,6-di-t-butylphenoxy)methyl aluminum and bis(2,4,6-tri-t-butylphenoxy)methyl aluminum; tris(substituted aryloxy) aluminum such as tris(2,6-diphenylphenoxy)aluminum; titanium tetraalkoxides such as titanium tetraisopropoxide; and the like can be mentioned. Of these, aluminum trialkoxide is preferable, with aluminum triisopropoxide being particularly preferable.

Examples of the amine include aliphatic primary amines such as methylamine, ethylamine, propylamine, isopropylamine, and butylamine; aliphatic secondary amines such as dimethylamine, diethylamine, dipropylamine, diisopropylamine, and dibutylamine; aliphatic tertiary amines such as trimethylamine, triethylamine, tripropylamine, triisopropylamine, and tributylamine; aliphatic polyamines such as N,N,N',N'-tetramethylethylenediamine, N,N,N',N'',N''-pentamethyldiethylenetriamine, and 1,1,4,7,10,10-hexamethyltriethylenetetramine; aromatic primary amines such as aniline and toluidine; aromatic secondary amines such as diphenylamine; and aromatic tertiary amines such as triphenylamine. Of these, aliphatic amines, particularly, butylamine, dibutylamine, tributylamine, and the like are preferable.

Although there are no specific limitations to proportions of the components in the polymerization initiator system comprising a transition metal complex, organic halide, and Lewis acid or an amine, if the ratio of the transition metal complex to the organic halide is too small, the polymerization tends to be retarded, and if this ratio is too large, molecular weight distribution of the resulting polymer tends to be broad. The molar ratio of the transition metal complex to the organic halide is preferably 0.05:1-1:1. If the ratio of the Lewis acid or amine to the transition metal complex is too small, the polymerization tends to be retarded, and if this ratio is too large, the molecular weight distribution of the resulting polymer tends to be broad. The molar ratio of the organic halide to the Lewis acid or amine is preferably 1:1-1:10.

The living radical polymerization initiator system can be prepared by mixing the polymerization initiators such as the transition metal complex and organic halide with activators such as the Lewis acid or amine, usually immediately before use. It is also possible to separately preserve the transition metal complex, polymerization initiator, and activator, add these components respectively to the polymerization system, and mix in the polymerization system to cause them to function as the living radical polymerization initiator system.

As other living radical polymerization initiator, a compound of the following formula (8) can be given.

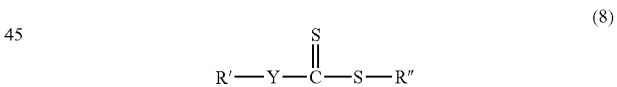

wherein R' represents an alkyl group or an aryl group having 1-15 carbon atoms which may contain an ester group, ether group, amino group, or amide group; Y represents a single bond, oxygen atom, nitrogen atom, or sulfur atom; and R'' represents an alkyl group or an aryl group having 1-15 carbon atoms which may contain an ester group, ether group, or amino group.

As preferable examples for R' when Y is a single bond, a methyl group, ethyl group, propyl group, butyl group, cyclohexyl group, norbornyl group, dinorbornyl group, adamantyl group, phenyl group, benzyl group, hydroxymethyl group, hydroxyethyl group, hydroxycyclohexyl group, and the like can be given.

As particularly preferable examples for R' when Y is an oxygen atom, a methyl group, ethyl group, propyl group, butyl group, cyclohexyl group, norbornyl group, dinorbornyl group, adamantyl group, phenyl group, benzyl group, hydroxymethyl group, hydroxyethyl group, hydroxycyclohexyl group, and the like can be given.

When Y is a nitrogen atom, R'—Y— in the above formula (8) is a group (R')(R')N—, in which R' individually represents, particularly preferably, a methyl group, ethyl group, propyl group, butyl group, cyclohexyl group, norbornyl group, dinorbornyl group, adamantyl group, phenyl group, benzyl group, hydroxymethyl group, hydroxyethyl group, hydroxycyclohexyl group, piperidinyl group, dimethylamino group, diethylamino group, acetamide group, and the like. R' may form a ring. As examples of such a ring, groups shown by the following formulas (8-1) to (8-3) can be given.

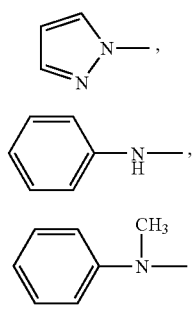

As particularly preferable examples for R' when Y is a sulfur atom, a methyl group, ethyl group, propyl group, butyl group, cyclohexyl group, norbornyl group, dinorbornyl group, adamantyl group, phenyl group, benzyl group, hydroxymethyl group, hydroxyethyl group, hydroxycyclohexyl group, and the like can be given.

As particularly preferable examples of R", the groups shown by the following formulas (8-4) to (8-8) can be given.

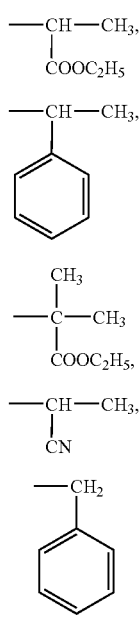

The above-mentioned polymerization initiators can be used together with a heat or photo-radical generator. Specific examples of the heat radical generator include: 2,2-azobis (isobutylonitrile), 2,2'-azobis(2-cyano-2-butane), dimethyl-2,2'-azobisdimethylisobutyrate, 4,4'-azobis(4-cyanopentanic acid), 1,1'-azobis(cyclohexanecarbonitrile), 2-(t-butylazo)-2-cyanopropane, 2,2'-azobis[2-methyl-N-(1,1)-bis(hydroxymethyl)-2-hydroxyethyl]propionamide, 2,2'-azobis[2-methyl-N-hydroxyethyl]propionamide, 2,2'-azobis(N,N'-dimethyleneisobutylamidine)dihydrochloride, 2,2'-azobis(2-aminopropane)dihydrochloride, 2,2'-azobis(N,N'-dimethyleneisobutylamine), 2,2'-azobis(2-methyl-N-[1,1-bis(hydroxymethyl)-2-hydroxyethyl]propionamide), 2,2'-azobis(2-methyl-N-[1,1-bis(hydroxymethyl)ethyl] propionamide), 2,2'-azobis[2-methyl-N-(2-hydroxyethyl) propionamide], 2,2-azobis(isobutylamide)dihydrate, 2,2'-azobis(2,2,4-trimethylpentane), 2,2'-azobis(2-methylpropane), t-butylperoxyacetate, t-butylperoxybenzoate, t-butylperoxyoctoate, t-butylperoxyneodecanoate, t-butylperoxyisobutyrate, t-amylperoxypivalate, t-butylperoxypivalate, diisopropylperoxydicarbonate, dicyclohexylperoxydicarbonate, dicumylperoxide, dibenzoylperoxide, dilauroylperoxide, potassium peroxydisulfate, ammonium peroxydisulfate, butyl di-t-hyponitrite, dicumyl hyponitrite, and the like.

As examples of the solvent which can be used for the living radical polymerization, cycloalkanes such as cyclohexane and cycloheptane; saturated carboxylic acid esters such as ethyl acetate, n-butyl acetate, i-butyl acetate, methyl propionate, and propylene glycol monomethyl ether acetate; alkyllactones such as γ-butyrolactone; ethers such as tetrahydrofuran, dimethoxyethanes, and diethoxyethanes; alkylketones such as 2-butanone, 2-heptanone, and methyl isobutyl ketone; cycloalkylketones such as cyclohexanone; alcohols such as 2-propanol and propylene glycol monomethyl ether; aromatic compounds such as toluene, xylene, and chlorobenzene; nonproton polar solvents such as dimethylformamide, dimethylsulfoxide, dimethylacetamide, and N-methyl-2-pyrrolidone; and the like can be given. The living radical polymerization may also be carried out without using a solvent.

These solvents may be used either individually or in combination of two or more.

The polymerization temperature is usually 40-150° C., and preferably 50-130° C. The reaction time is usually 1-96 hours, and preferably 1-48 hours.

In the acid-labile group-containing resin of the present invention, the recurring units forming the resin are preferably polymerized by random polymerization, not by block polymerization.

To randomly polymerize the monomers forming the recurring units, monomers forming the recurring units (1)-(7) are polymerized in a lump or a mixture of these monomers is dropped to polymerize.

It is preferable that the resulting acid-labile group-containing resin is almost free from impurities such as halogen and metals and the content of residual monomers and oligomers should be less than prescribed amount, for example, 0.1 wt % or less when measured by HPLC. This not only further improves sensitivity, resolution, process stability, pattern shape, and the like as a resist, but also enables provision of a resist having no foreign particle in the solution and showing no change in sensitivity over time.

The acid-labile group-containing resin obtained by the living radical polymerization method may contain a residue originating from the initiator at the molecule chain terminal. Although such a residue may be present, the residue can be removed using an excess amount of radical polymerization initiator. The polymer terminal processing may be carried out either after completion of the living radical polymerization reaction or after purification of the polymer produced by the living radical polymerization reaction.

Any radical polymerization initiator which can generate radicals under the molecular chain terminal processing conditions can be used. As radical generating conditions, heat, light, γ-rays, and high energy radiations such as electron beams can be given.

As specific examples of the radical polymerization initiator, initiators such as peroxides and azo compounds can be given. Specific radical polymerization initiators include, but are not limited to, t-butylhydroperoxide, t-butylperbenzoate, benzoylperoxide, 2,2'-azobis(2,4-dimethylvaleronitrile), 2,2'-azobisisobutyronitrile (AIBN), 1,1'-azobis(cyclohexanecarbonitrile), dimethyl-2,2'-azobisisobutyrate (MAIB), benzoin ether, benzophenone, and the like.

When a heat radical polymerization initiator is used, the temperature for the terminal processing reaction of the resin is about 20-200° C., preferably 40-150° C., and more preferably 50-100° C. The reaction is carried out under an inert atmosphere of nitrogen, argon, or the like or under atmospheric conditions. The reaction may be carried out either under normal pressure or under pressurized conditions. A radical polymerization initiator that can generate radicals in an amount equivalent to 1-800 mol %, preferably 50-400 mol %, more preferably 100-300 mol %, and still more preferably 200-300 mol % of the total mols of the residues that are present in the polymer of which the terminals are processed is introduced.

The terminal processing reaction time is usually 0.5-72 hours, preferably 1-24 hours, and still more preferably 2-12 hours. The removal rate of the residual groups such as a thio group from the polymer terminals is at least 50%, preferably at least 75%, more preferably 85%, and still more preferably 95%. The polymer of which the terminals are processed is replaced with a new radical species, for example, with a fragment of a radical initiator originating from the radical initiator used for the terminal processing reaction. A resulting polymer has a new group in the terminal and can be used according to the application.

A method of polymer terminal processing described in WO 02/090397 can also be used for removing the residues originating from the polymerization initiators.

As examples of the purification method for the acid-labile group-containing resin, the following methods can be given. As a method for removing impurities such as metals, a method of putting metals in the resin solution to be adsorbed using a zeta-potential filter, a method of causing metals to be in a chelate state by washing the resin solution with an acidic aqueous solution such as oxalic acid or sulfonic acid and removing the metals, and the like can be given. As a method for removing the residual monomers and oligomer components at a specific value or less, a liquid-liquid extraction method in which the residual monomers and oligomer components are removed by combining washing with water and a suitable solvent, a purification method in a liquid state such as ultrafiltration in which only the monomers and oligomer components having a specific molecular weight or less are extracted and removed, a reprecipitation method in which the residual monomers and the like are removed by adding the resin solution to a poor solvent dropwise, thereby causing the resin to coagulate in the poor solvent, and a purification method in a solid state in which the resin slurry separated by filtration is washed with a poor solvent can be given. These methods may be used in combination.

The type of the poor solvent used in the reprecipitation method is varied depending the properties of the resin to be purified and the like. Such a poor solvent is therefore appropriately selected.

The polystyrene-reduced weight average molecular weight of the acid-labile group-containing resin determined by gel permeation chromatography (GPC) is usually 1,000-300,000, preferably 2,000-200,000, and still more preferably 3,000-100,000. If the Mw of the resin is less than 1,000, heat resistance as a resist may be decreased. If the Mw exceeds 300,000, developability as a resist may be decreased.

Mw/Mn of the resin is 1.0-1.5, and preferably 1.0-1.3.

In the present invention, the acid-labile group-containing resins can be used either individually or in combination of two or more.

A radiation-sensitive resin composition can be obtained by combining the acid-labile group-containing resin and a photoacid generator which generates an acid by being irradiated with radiation.

As preferable examples of the photoacid generator, triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium 2-(3-tetracyclo[4.4.0.1$^{2,5}$.1$^{7,10}$]dodecanyl)-1,1-difluoroethanesulfonate, triphenylsulfonium N,N-bis(nonafluoro-n-butanesulfonyl)imidate, triphenylsulfonium camphorsulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-cyclohexylphenyldiphenylsulfonium 2-(3-tetracyclo[4.4.0.1$^{2,5}$.1$^{7,10}$]dodecanyl)-1,1-difluoroethanesulfonate, 4-cyclohexylphenyldiphenylsulfonium N,N-bis(nonafluoro-n-butanesulfonyl)imidate, 4-cyclohexylphenyldiphenylsulfonium camphorsulfonate, 4-t-butylphenyldiphenylsulfonium trifluoromethanesulfonate, 4-t-butylphenyldiphenylsulfonium nonafluoro-n-butanesulfonate, 4-t-butylphenyldiphenylsulfonium perfluoro-n-octanesulfonate, 4-t-butylphenyldiphenylsulfonium 2-bicyclo[2.2.1]hept-2-yl-1,1,2,2-tetrafluoroethanesulfonate, 4-t-butylphenyldiphenylsulfonium 2-(3-tetracyclo[4.4.0.1$^{2,5}$.1$^{7,10}$]dodecanyl)-1,1-difluoroethanesulfonate, 4-t-butylphenyldiphenylsulfonium N,N-bis(nonafluoro-n-butanesulfonyl)imidate, 4-t-butylphenyldiphenylsulfonium camphorsulfonate, tri(4-t-butylphenyl)sulfonium trifluoromethanesulfonate, tri(4-t-butylphenyl)sulfonium nonafluoro-n-butanesulfonate, tri(4-t-butylphenyl)sulfonium perfluoro-n-octanesulfonate, tri(4-t-butylphenyl)sulfonium 2-bicyclo[2.2.1]hept-2-yl-1,1,2,2-tetrafluoroethanesulfonate, tri(4-t-butylphenyl)sulfonium 2-(3-tetracyclo[4.4.0.1$^{2,5}$.1$^{7,10}$]dodecanyl)-1,1-difluoroethanesulfonate, tri(4-t-butylphenyl)sulfonium N,N-bis(nonafluoro-n-butanesulfonyl)imidate, tri(4-t-butylphenyl)sulfonium camphorsulfonate, diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, diphenyliodonium 2-(3-tetracyclo[4.4.0.1$^{2,5}$.1$^{7,10}$]dodecanyl)-1,1-difluoroethanesulfonate, diphenyliodonium N,N-bis(nonafluoro-n-butanesulfonyl)imidate, diphenyliodonium camphorsulfonate, bis(4-t-butylphenyl)iodoniumtrifluoromethane sulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-(bicyclo[2.2.1]hept-2-yl)-1,1,2,2-tetrafluoroethanesulfonate, bis(4-t-butylphenyl)iodonium 2-(3-tetracyclo[4.4.0.1$^{2,5}$.1$^{7,10}$]dodecanyl)-1,1-difluoroethanesulfonate, bis(4-t-butylphenyl)iodonium N,N-bis(nonafluoro-n-butanesulfonyl)imidate, bis(4-t-butylphenyl)iodonium camphorsulfonate, 1-(4-n-butoxynaphthalen-1-yl)

tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(4-n-butoxynaphthalen-1-yl)tetrahydrothiophenium 2-(3-tetracyclo[4.4.0.1$^{2,5}$.1$^{7,10}$]dodecanyl-1,1-difluoroethanesulfonate, 1-(4-n-butoxynaphthalen-1-yl)tetrahydrothiophenium N,N-bis(nonafluoro-n-butanesulfonyl)imidate, 1-(4-n-butoxynaphthalen-1-yl)tetrahydrothiophenium camphorsulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-(bicyclo[2.2.1]hept-2-yl)-1,1,2,2-tetrafluoroethanesulfonate, 1-(3,5-dimethyl-4-hydroxyphenyl)tetrahydrothiophenium 2-(3-tetracyclo[4.4.0.1$^{2,5}$.1$^{7,10}$]dodecanyl-1,1-difluoroethanesulfonate, 1-(3,5-dimethyl-4-hydroxyphenyl)tetrahydrothiophenium N,N-bis(nonafluoro-n-butanesulfonyl)imidate, 1-(3,5-dimethyl-4-hydroxyphenyl)tetrahydrothiophenium camphorsulfonate, N-(trifluoromethanesulfonyloxy)succinimide, N-(nonafluoro-n-butanesulfonyloxy)succinimide, N-(perfluoro-n-octanesulfonyloxy)succinimide, N-(2-bicyclo[2.2.1]hept-2-yl-1,1,2,2-tetrafluoroethanesulfonyloxy)succinimide, N-(2-(3-tetracyclo[4.4.0.1$^{2,5}$.1$^{7,10}$]dodecanyl)-1,1-difluoroethanesulfonyloxy)succinimide, N-(camphorsulfonyloxy)succinimide, N-(trifluoromethanesulfonyloxy)bicyclo[2.2.1]hept-5-ene-2,3-dicarboxyimide, N-(nonafluoro-n-butanesulfonyloxy)bicyclo[2.2.1]hept-5-ene-2,3-dicarboxyimide, N-(perfluoro-n-octanesulfonyloxy)bicyclo[2.2.1]hept-5-ene-2,3-dicarboxyimide, N-(2-bicyclo[2.2.1]hept-2-yl-1,1,2,2-tetrafluoroethanesulfonyloxy)bicyclo[2.2.1]hept-5 ene-2,3-dicarboxyimide, N-(2-(3-tetracyclo[4.4.0.1$^{2,5}$.1$^{7,10}$]dodecanyl)-1,1-difluoroethanesulfonyloxy)bicyclo [2.2.1]hept-5-ene-2,3-dicarboxyimide, N-(camphorsulfonyloxy)bicyclo[2.2.1]hept-5-ene-2,3-dicarboxyimide, and the like can be given.

In the present invention, the photoacid generator can be used either individually or in combinations of two or more.

The amount of photoacid generator to be used is usually 0.1-20 parts by weight, and preferably 0.1-7 parts by weight for 100 parts by weight of the acid-labile group-containing resin in order to ensure sensitivity and developability as a resist. If the amount of photoacid generator is less than 0.1 part by weight, sensitivity and developability may be decreased. If the amount exceeds 20 parts by weight, a rectangular resist pattern may not be obtained due to decreased transparency to radiation.

An acid diffusion controller is preferably added to the radiation-sensitive resin composition of the present invention. The acid diffusion controller controls diffusion of an acid generated from the acid generator upon exposure in the resist film and prevents unfavorable chemical reactions in the unexposed region.

The addition of such an acid diffusion controller improves storage stability of the resulting radiation-sensitive resin composition and resolution as a resist. Moreover, the addition of the acid diffusion controller prevents the line width of the resist pattern from changing due to changes in the post-exposure delay (PED) between exposure and development, whereby a composition with remarkably superior process stability can be obtained.

As the acid diffusion controller, nitrogen-containing organic compounds of which the basicity does not change due to exposure or heat treatment during formation of a resist pattern are preferable.

As examples of the nitrogen-containing organic compound, tertiary amine compounds, amide group-containing compounds, quaternary ammonium hydroxide compounds, and nitrogen-containing heterocyclic compounds can be given.

Examples of the tertiary amine compound include tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyl dimethylamine, dicyclohexyl methylamine, and tricyclohexylamine; aromatic amines such as aniline, N-methylaniline, N,N-dimethylaniline, 2-methylaniline, 3-methylaniline, 4-methylaniline, 4-nitroaniline, 2,6-dimethylaniline, 2,6-diisopropylaniline, diphenylamine, triphenylamine, and naphthylamine; alkanolamines such as triethanolamine and diethanolaniline; N,N,N',N'-tetramethylethylenediamine, N,N,N',N'-tetrakis(2-hydroxypropyl)ethylenediamine, 1,3-bis[1-(4-aminophenyl)-1-methylethyl]benzene tetramethylenediamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, and the like.

Examples of the amide group-containing compound include, N-t-butoxycarbonyl group-containing amino compounds such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, 1-(t-butoxycarbonyl)-2-pyrrolidine methanol, t-butyl(tetrahydro-2-oxa-3-furanyl)carbamate, N,N'-di-t-butoxycarbonyl-4,4'-diaminodiphenylmethane, N-t-butoxycarbonylbenzimidazole, N-t-butoxycarbonyl-2-methylbenzimidazole, N-t-butoxycarbonyl-2-phenylbenzimidazole, and the like.

As examples of the quaternary ammonium hydroxide compound, tetramethylammonium hydroxide, tetraethylammonium hydroxide, tetra-n-propylammonium hydroxide, and tetra-n-butylammonium hydroxide can be given.

Examples of the nitrogen-containing heterocyclic compounds include: imidazoles such as imidazole, 4-methylimidazole, 1-benzyl-2-methylimidazole, 4-methyl-2-phenylimidazole, benzimidazole, and 2-phenylbenzimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine, 1-(2-hydroxyethyl)piperazine; and pyrazine, pyrazole, pyridazine, quinoxaline, purine, pyrrolidine, piperidine, 3-piperidino-1,2-propanediol, morpholine, 4-methylmorpholine, 1,4-dimethylpiperazine, and 1,4-diazabicyclo[2.2.2]octane.

Of these nitrogen-containing organic compounds, the tertiary amine compounds, amide group-containing compounds, and nitrogen-containing heterocyclic compounds are preferable. Among the amide group-containing compounds, N-t-butoxycarbonyl group-containing amino compounds are particularly preferable. Among the nitrogen-containing heterocyclic compounds, imidazoles are particularly preferable.

The acid diffusion controllers may be used either individually or in combination of two or more.

The amount of the acid diffusion controller to be added is usually 15 parts by weight or less, preferably 10 parts by weight or less, and still more preferably 5 parts by weight or less for 100 parts by weight of the resin. If the amount of the acid diffusion controller exceeds 15 parts by weight, sensitivity as a resist and developability of the exposed area tend to decrease. If the amount is less than 0.001 part by weight, the pattern shape or dimensional accuracy as a resist may decrease depending on the processing conditions.

Additives containing or not containing an acid-labile organic group which further improve dry etching resistance, pattern shape, adhesion to substrate, or the like may be added to the radiation-sensitive resin composition of the present invention.

As examples of such additives, adamantane derivatives such as t-butyl 1-adamantanecarboxylate, t-butoxycarbonylmethyl 1-adamantanecarboxylate, γ-butyrolactone 1-adamantanecarboxylate, di-t-butyl 1,3-adamantanedicarboxylate, t-butyl 1-adamantaneacetate, t-butoxycarbonylmethyl 1-adamantaneacetate, di-t-butyl 1,3-adamantanediacetate, 2,5-dimethyl-2,5-di(adamantylcarbonyloxy)hexane, t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, mevalonolactone deoxycholate, t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, mevalonolactone lithocholate, dimethyl adipate, diethyl adipate, dipropyl adipate, di-n-butyl adipate, di-t-butyl adipate, and the like can be given.

These alicyclic additives may be used either individually or in combination of two or more.

The amount of the alicyclic additives to be added is usually 50 parts by weight or less, and preferably 30 parts by weight or less for 100 parts by weight of the resin. If the amount of the alicyclic additives exceeds 50 parts by weight, heat resistance as a resist tends to decrease.

A surfactant which improves applicability, developability, and the like may be added to the radiation-sensitive resin composition of the present invention.

As examples of the surfactant, nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate; and commercially available products such as KP341 (manufactured by Shin-Etsu Chemical Co., Ltd.), POLYFLOW No. 75, No. 95 (manufactured by Kyoeisha Chemical Co., Ltd.), FTOP EF301, EF303, EF352 (manufactured by Tohkem Products Corporation), MEGAFAC F171, F173 (manufactured by Dainippon Ink and Chemicals, Inc.), Fluorad FC430, FC431 (manufactured by Sumitomo 3M Ltd.), Asahi Guard AG710, and Surflon S-382, SC-101, SC-102, SC-103, SC-104, SC-105, SC-106 (manufactured by Asahi Glass Co., Ltd.) can be given.

The surfactants may be used either individually or in combination of two or more. The amount of surfactants to be added is usually 2 parts by weight or less for 100 parts by weight of the resin.

A photosensitizer which improves sensitivity and the like may be added to the radiation-sensitive resin composition of the present invention. As examples of photosensitizers, carbazoles, benzophenones, rose bengals, anthracenes, and phenols can be given. These sensitizers may be used either individually or in combinations of two or more. The amount of photosensitizers to be added is preferably 50 parts by weight or less for 100 parts by weight of the resin.

As examples of other additives, halation inhibitors, adhesion promoters, storage stabilizers, anti-foaming agents, and the like can be given.

The radiation-sensitive resin composition of the present invention is made into a composition solution by dissolving the composition in a solvent so that the total solid content is usually 3-50 wt %, and preferably 5-25 wt %, and filtering the solution using a filter with a pore diameter of about 0.2 μm, for example.

As solvents used for preparing the solution composition, 2-hexanone, 2-heptanone, 2-octanone, cyclopentanone, cyclohexanone, propylene glycol monomethyl ether acetate, propylene glycol monoethyl ether acetate, methyl 2-hydroxypropionate, ethyl 2-hydroxypropionate, methyl 3-ethoxypropionate, ethyl 3-ethoxypropionate, ethylene glycol monomethyl ether, ethylene glycol monoethyl ether, diethylene-glycol dimethyl ether, diethylene-glycol diethyl ether, ethylene glycol monomethyl ether acetate, ethylene glycol monoethyl ether acetate, propylene glycol monomethyl ether, propylene glycol monoethyl ether, n-butyl acetate, methylpyruvate, ethyl pyruvate, N-methyl pyrrolidone, diethylene glycol monomethyl ether, diethylene glycol monoethyl ether, γ-butyrolactone, and the like can be given.

These solvents may be used either individually or in combination of two or more. Of the above examples, 2-heptanone, cyclohexanone, propylene glycol monomethyl ether acetate, ethyl 2-hydroxypropionate, ethyl 3-ethoxypropionate, propylene glycol monomethyl ether, γ-butyrolactone, and the like are preferable.

The radiation-sensitive resin composition of the present invention is particularly useful as a chemically-amplified resist. In the chemically-amplified resist, an acid-labile group in the resin dissociates by the action of an acid generated from the acid generator upon exposure, thereby producing a carboxyl group. As a result, solubility of the exposed part of the resist in an alkaline developer increases, whereby the exposed part is dissolved in an alkaline developer and removed to obtain a positive-tone resist pattern.

A resist pattern is formed from the radiation-sensitive resin composition of the present invention by applying the composition solution to, for example, substrates such as a silicon wafer and a wafer coated with aluminum using an appropriate application method such as rotational coating, cast coating, roll coating, or spray coating to form a resist film. The resist film is then optionally pre-baked (hereinafter called "PB") and exposed to form a predetermined resist pattern. As the radiation, ultraviolet rays, deep ultraviolet rays such as KrF excimer laser (wavelength: 248 nm), ArF excimer laser (wavelength: 193 nm), $F_2$ excimer laser (wavelength: 157 nm), and EUV (extreme ultraviolet rays, wavelength: 13 nm, etc.), charged particle rays such as electron beams, X-rays such as synchrotron radiation, or the like may be appropriately used. Of these, deep ultraviolet rays and electron beams are preferable. The exposure conditions such as the light exposure are appropriately determined depending on the composition of the radiation-sensitive resin composition, types of additives, and the like.

It is preferable to perform post exposure bake (hereinafter called "PEB") in order to stably form a highly-accurate minute pattern. The PEB ensures smooth dissociation of the acid-labile group in the resin. The heating temperature for the PEB is usually 30-200° C., and preferably 50-170° C., although the heating conditions are changed depending on the composition of the radiation-sensitive resin composition.

In order to bring out maximum potentiality of the radiation-sensitive resin composition of the present invention, an organic or inorganic anti-reflection film may be formed on a substrate as disclosed in Japanese Patent Publication No. 1994-12452, for example. Moreover, a protection film may be formed on the resist film as disclosed in Japanese Patent Application Laid-open No. 1993-188598, for example, in order to prevent the effects of basic impurities and the like in an environmental atmosphere. These techniques may be employed in combination.

The exposed resist film is then developed to form a prescribed resist pattern.

An alkaline aqueous solution in which tetramethylammonium hydroxide is dissolved, for example, is preferable as the developer used for development. The concentration of the alkaline aqueous solution is usually 10 wt % or less. If the concentration of the alkaline aqueous solution exceeds 10 wt %, an unexposed area may also be dissolved in the developer. In addition, surfactants or the like may be added to the developer containing the alkaline aqueous solution in an appropriate amount. After development using the alkaline aqueous solution developer, the resist film is generally washed with water and dried.

EXAMPLES

The present invention will be described in more detail by way of examples. In the examples, "part" refers to "part by weight" unless otherwise indicated.

Measurements and evaluation in the examples and comparative examples were carried out as follows.

(1) Mw, Mn, and the Conversion Rate into Polymers

The Mw and Mn were measured by gel permeation chromatography (GPC) using GPC columns (manufactured by Tosoh Corp., G2000H$_{XZ}$×2, G3000H$_{XZ}$×1, G4000H$_{XZ}$×1) under the following conditions: Flow rate: 1.0 ml/min., eluate: tetrahydrofuran, column temperature: 40° C., standard reference material: monodispersed polystyrene. The conversion rate into polymers was calculated from the area ratio of each peak.

(2) Sensitivity

When irradiating with light from an ArF light source, a composition solution was applied to a silicon wafer (ARC29) with a 78 nm thickness ARC29 film (manufactured by Brewer Science Corp.) by spin coating and post-baked on a hot plate under the conditions shown in Table 4 to obtain a resist coating with a thickness of 340 nm. The resist film was exposed to ArF excimer laser through a mask pattern using an ArF excimer laser exposure apparatus (manufactured by Nikon Corp., lens numerical aperture: 0.55). After performing PEB under the conditions shown in Table 4, the resist film was developed at 25° C. for 60 seconds in a 2.38 wt % tetramethylammonium hydroxide aqueous solution, washed with water, and dried to form a positive-tone resist pattern. An optimum dose at which a line-and-space (1L1S) pattern with a line width of 160 nm was formed was taken as sensitivity.

(3) Line Edge Roughness (LER) Observation

In the observation of a 160 nm 1L/1S pattern developed with an optimum dose of exposure, the line width was inspected at arbitrary points from above the pattern using SEM (scanning electron microscope) S9220 manufactured by Hitachi, Ltd. and the fluctuation of the measurement was expressed by 3 Sigma.

(4) Molecular Weight Difference Between Lots

In the following Synthesis Examples, acid-labile group-containing resins were prepared five times under the same conditions to measure Mw of the resins. The standard deviation with five measurements was determined and the results were considered to be the molecular weight difference between lots.

Synthesis Example 1

(S1-1)

(S2-1)

42.87 g (40 mol %) of a compound (S1-1) and 57.13 g (60 mol %) of a compound (S2-1) were dissolved in 200 g of toluene. A 1,000 ml three-necked flask charged with 100 g of toluene, 2.71 g of 2-hydroxyethyl 2-bromopropionate, 10.63 g of chloroindenylbis(triphenylphosphine)ruthenium, and 2.38 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (78 g, yield 78%). The resin was a copolymer with a Mw of 6,600, Mw/Mn ratio of 1.37, and a ratio of the recurring units of the compound (S1-1) to the compound (S2-1) of 39.1:60.9 (mol %). This resin is referred to as "resin (A-1)".

Synthesis Example 2

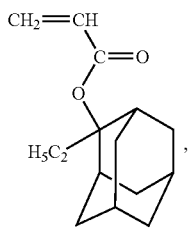
(S1-2)

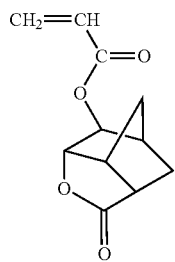
(S2-2)

42.87 g (40 mol %) of a compound (S1-2) and 57.13 g (60 mol %) of a compound (S2-2) were dissolved in 200 g of toluene. A 1,000 ml three-necked flask charged with 100 g of toluene and 2.86 g of ethyl 2-methoxythiocarbonylsulfanyl-propionate was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (75 g, yield 75%). The resin was a copolymer with a Mw of 7,000, Mw/Mn ratio of 1.28, and a ratio of the recurring units of the compound (S1-2) to the compound (S2-2) of 39.1:60.9 (mol %). This resin is referred to as "resin (A-2)".

Synthesis Example 3

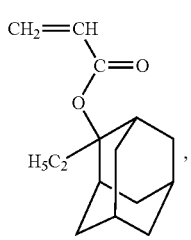
(S1-3)

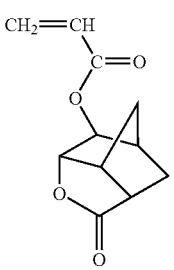
(S2-3)

42.87 g (40 mol %) of a compound (S1-3) and 57.13 g (60 mol %) of a compound (S2-3) were dissolved in 200 g of toluene. A 1,000 ml three-necked flask charged with 100 g of toluene and 3.34 g of methyl 2-(2,2,6,6-tetramethyl-piperidin-1-yloxy)-propionate was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (80 g, yield 80%). The resin was a copolymer with a Mw of 7,800, Mw/Mn ratio of 1.45, and a ratio of the recurring units of the compound (S1-3) to the compound (S2-3) of 39.1:60.9 (mol %). This resin is referred to as "resin (A-3)".

Synthesis Example 4

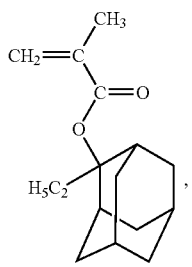
(S1-4)

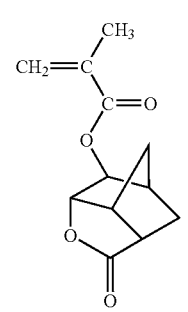
(S2-4)

42.69 g (40 mol %) of a compound (S1-4) and 57.31 g (60 mol %) of a compound (S2-4) were dissolved in 200 g of toluene. A 1,000 ml three-necked flask charged with 100 g of toluene, 2.55 g of 2-hydroxyethyl 2-bromopropionate, 9.99 g of chloroindenylbis(triphenylphosphine)ruthenium, and 2.24 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (78 g, yield 78%). The resin was a copolymer with a Mw of 7,400, Mw/Mn ratio of 1.40, and a ratio of the recurring units of the compound (S1-4) to the compound (S2-4) of 38.5:61.5 (mol %). This resin is referred to as "resin (A-4)".

Synthesis Example 5

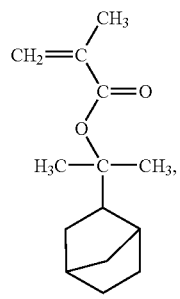
(S1-5)

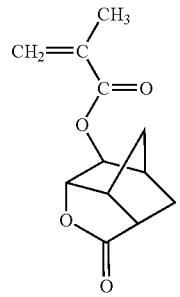
(S2-5)

40.01 g (40 mol %) of a compound (S1-5) and 59.99 g (60 mol %) of a compound (S2-5) were dissolved in 200 g of toluene. A 1,000 ml three-necked flask charged with 100 g of toluene, 2.67 g of 2-hydroxyethyl 2-bromopropionate, 10.46 g of chloroindenylbis(triphenylphosphine)ruthenium, and 2.34 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (76 g, yield 76%). The resin was a copolymer with a Mw of 7,600, Mw/Mn ratio of 1.41, and a ratio of the recurring units of the compound (S1-5) to the compound (S2-5) of 39.1:60.9 (mol %). This resin is referred to as "resin (A-5)".

Synthesis Example 6

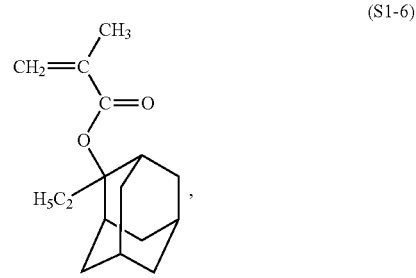
(S1-6)

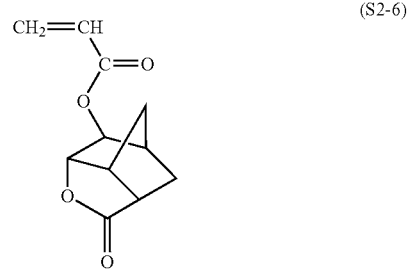
(S2-6)

44.30 g (40 mol %) of a compound (S1-6) and 55.70 g (60 mol %) of a compound (S2-6) were dissolved in 200 g of toluene. A 1,000 ml three-necked flask charged with 100 g of toluene, 2.64 g of 2-hydroxyethyl 2-bromopropionate, 10.37 g of chloroindenylbis(triphenylphosphine)ruthenium, and 2.32 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (76 g, yield 76%). The resin was a copolymer with a Mw of 6,500, Mw/Mn ratio of 1.35, and a ratio of the recurring units of the compound (S1-6) to the compound (S2-6) of 38.5:61.5 (mol %). This resin is referred to as "resin (A-6)".

Synthesis Example 7

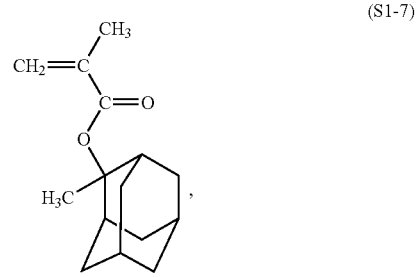
(S1-7)

(S2-7)

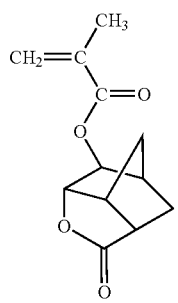

41.28 g (40 mol %) of a compound (S1-7) and 58.72 g (60 mol %) of a compound (S2-7) were dissolved in 200 g of toluene. A 1,000 ml three-necked flask charged with 100 g of toluene, 2.71 g of 2-hydroxyethyl 2-bromopropionate, 10.63 g of chloroindenylbis(triphenylphosphine)ruthenium, and 2.38 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (77 g, yield 77%). The resin was a copolymer with a Mw of 7,700, Mw/Mn ratio of 1.46, and a ratio of the recurring units of the compound (S1-7) to the compound (S2-7) of 38.5:61.5 (mol %). This resin is referred to as "resin (A-7)".

Synthesis Example 8

(S1-8)

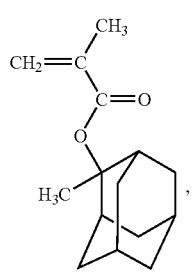

(S2-8)

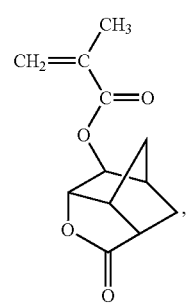

(S3-8)

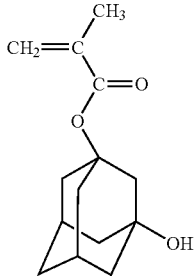

35.88 g (35 mol %) of a compound (S1-8), 48.61 g (50 mol %) of a compound (S2-8), and 15.51 g (15 mol %) of a compound (S3-8) were dissolved in 200 g of toluene. A 1,000 ml three-necked flask charged with 100 g of toluene, 2.16 g of 2-hydroxyethyl 2-bromopropionate, 8.48 g of chloroindenyl-bis(triphenylphosphine)ruthenium, and 1.90 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (72 g, yield 72%). The resin was a copolymer with a Mw of 7,800, Mw/Mn ratio of 1.44, and a ratio of the recurring units of the compound (S1-8), the compound (S2-8), and the compound (S3-8) of 34.0:51.1:14.9 (mol %). This resin is referred to as "resin (A-8)".

Synthesis Example 9

(S1-9)

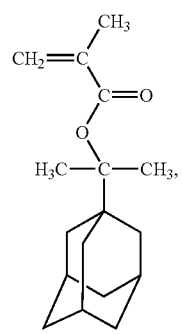

(S2-9)

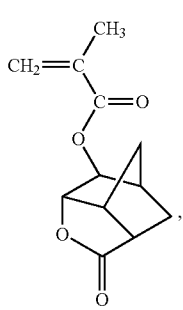

(S3-9)

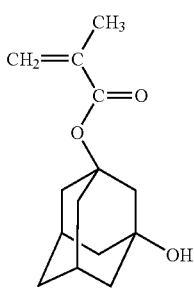

38.52 g (35 mol %) of a compound (S1-9), 46.61 g (50 mol %) of a compound (S2-9), and 14.87 g (15 mol %) of a compound (S3-9) were dissolved in 200 g of toluene. A 1,000 ml three-necked flask charged with 100 g of toluene, 2.07 g of 2-hydroxyethyl 2-bromopropionate, 8.13 g of chloroindenyl-bis(triphenylphosphine)ruthenium, and 1.82 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (73 g, yield 73%). The resin was a copolymer with a Mw of 8,000, Mw/Mn ratio of 1.46, and a ratio of the recurring units of the compound (S1-9), the compound (S2-9), and the compound (S3-9) of 34.2:51.0:14.8 (mol %). This resin is referred to as "resin (A-9)".

(S3-10)

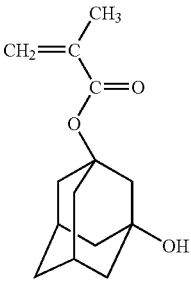

37.23 g (35 mol %) of a compound (S1-10), 47.59 g (50 mol %) of a compound (S2-10), and 15.18 g (15 mol %) of a compound (S3-10) were dissolved in 200 g of toluene. A 1,000 ml three-necked flask charged with 100 g of toluene, 2.12 g of 2-hydroxyethyl 2-bromopropionate, 8.30 g of chloroindenylbis(triphenylphosphine)ruthenium, and 1.86 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (73 g, yield 73%). The resin was a copolymer with a Mw of 7,800, Mw/Mn ratio of 1.48, and a ratio of the recurring units of the compound (S1-10), the compound (S2-10), and the compound (S3-10) of 33.2:51.5:15.3 (mol %). This resin is referred to as "resin (A-10)".

Synthesis Example 10

(S1-10)

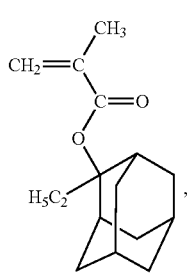

(S2-10)

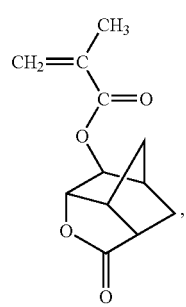

Synthesis Example 11

(S1-11)

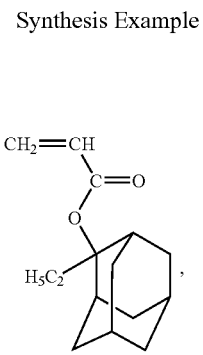

(S2-11)

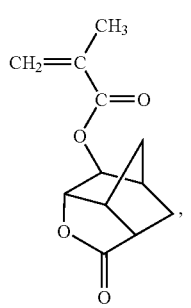

(S3-11)

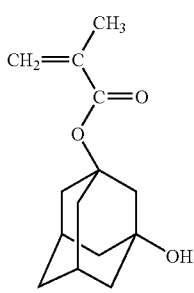

35.88 g (35 mol %) of a compound (S1-11), 48.61 g (50 mol %) of a compound (S2-11), and 15.51 g (15 mol %) of a compound (S3-11) were dissolved in 200 g of toluene. A 1,000 ml three-necked flask charged with 100 g of toluene, 2.16 g of 2-hydroxyethyl 2-bromopropionate, 8.48 g of chloroindenylbis(triphenylphosphine)ruthenium, and 1.90 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (73 g, yield 73%). The resin was a copolymer with a Mw of 8,500, Mw/Mn ratio of 1.42, and a ratio of the recurring units of the compound (S1-11), the compound (S2-11), and the compound (S3-11) of 34.0:51.0:15.0 (mol %). This resin is referred to as "resin (A-11)".

(S3-12)

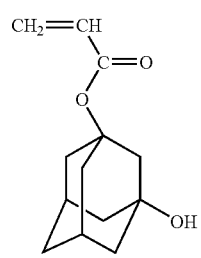

37.32 g (35 mol %) of a compound (S1-12), 47.37 g (50 mol %) of a compound (S2-12), and 15.31 g (15 mol %) of a compound (S3-12) were dissolved in 200 g of toluene. A 1,000 ml three-necked flask charged with 100 g of toluene, 2.61 g of 2-hydroxyethyl 2-bromopropionate, 10.24 g of chloroindenylbis(triphenylphosphine)ruthenium, and 2.29 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (72 g, yield 72%). The resin was a copolymer with a Mw of 8,100, Mw/Mn ratio of 1.33, and a ratio of the recurring units of the compound (S1-12), the compound (S2-12), and the compound (S3-12) of 34.5:50.5:15.0 (mol %). This resin is referred to as "resin (A-12)".

Synthesis Example 12

(S1-12)

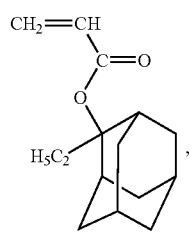

(S2-12)

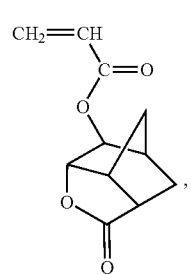

Synthesis Example 13

(S1-13)

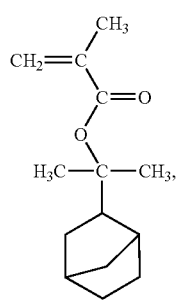

(S2-13)

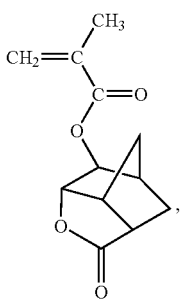

-continued (S3-13)

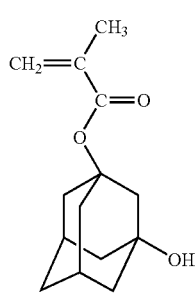

-continued (S3-14)

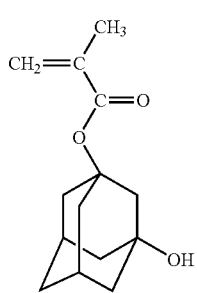

34.68 g (35 mol %) of a compound (S1-13), 49.52 g (50 mol %) of a compound (S2-13), and 15.80 g (15 mol %) of a compound (S3-13) were dissolved in 200 g of toluene. A 1,000 ml three-necked flask charged with 100 g of toluene, 2.20 g of 2-hydroxyethyl 2-bromopropionate, 8.63 g of chloroindenylbis(triphenylphosphine)ruthenium, and 1.93 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (71 g, yield 71%). The resin was a copolymer with a Mw of 7,900, Mw/Mn ratio of 1.45, and a ratio of the recurring units of the compound (S1-13), the compound (S2-13), and the compound (S3-13) of 34.3:50.6:15.1 (mol %). This resin is referred to as "resin (A-13)".

28.66 g (35 mol %) of a compound (S1-14), 54.09 g (50 mol %) of a compound (S2-14), and 17.25 g (15 mol %) of a compound (S3-14) were dissolved in 200 g of toluene. A 1,000 ml three-necked flask charged with 100 g of toluene, 2.41 g of 2-hydroxyethyl 2-bromopropionate, 9.43 g of chloroindenylbis(triphenylphosphine)ruthenium, and 2.11 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (73 g, yield 73%). The resin was a copolymer with a Mw of 8,500, Mw/Mn ratio of 1.41, and a ratio of the recurring units of the compound (S1-14), the compound (S2-14), and the compound (S3-14) of 34.2:50.9:14.9 (mol %). This resin is referred to as "resin (A-14)".

Synthesis Example 14

Synthesis Example 15

(S1-14)

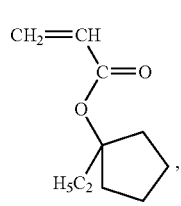

(S1-15)

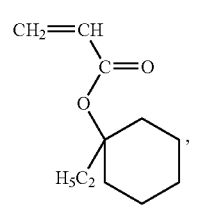

(S2-14)

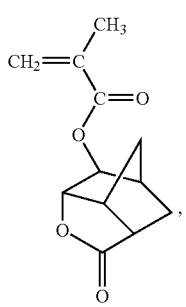

(S2-15)

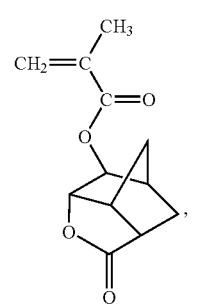

(S3-15)

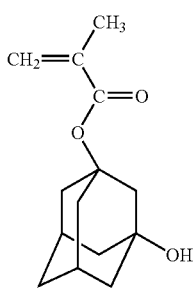

(S3-16)

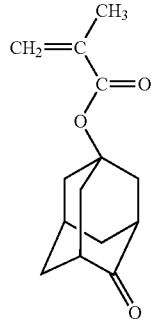

30.33 g (35 mol %) of a compound (S1-15), 52.82 g (50 mol %) of a compound (S2-15), and 16.85 g (15 mol %) of a compound (S3-15) were dissolved in 200 g of toluene. A 1,000 ml three-necked flask charged with 100 g of toluene, 2.35 g of 2-hydroxyethyl 2-bromopropionate, 9.21 g of chloroindenylbis(triphenylphosphine)ruthenium, and 2.06 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (72 g, yield 72%). The resin was a copolymer with a Mw of 8,100, Mw/Mn ratio of 1.41, and a ratio of the recurring units of the compound (S1-15), the compound (S2-15), and the compound (S3-15) of 34.1:51.1:14.8 (mol %). This resin is referred to as "resin (A-15)".

35.93 g (35 mol %) of a compound (S1-16), 48.68 g (50 mol %) of a compound (S2-16), and 15.39 g (15 mol %) of a compound (S3-16) were dissolved in 200 g of toluene. A 1,000 ml three-necked flask charged with 100 g of toluene, 2.17 g of 2-hydroxyethyl 2-bromopropionate, 8.49 g of chloroindenylbis(triphenylphosphine)ruthenium, and 1.90 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (74 g, yield 74%). The resin was a copolymer with a Mw of 8,500, Mw/Mn ratio of 1.49, and a ratio of the recurring units of the compound (S1-16), the compound (S2-16), and the compound (S3-16) of 34.0:50.9:15.1 (mol %). This resin is referred to as "resin (A-16)".

Synthesis Example 16

Synthesis Example 17

(S1-16)

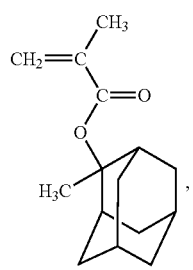

(S1-17)

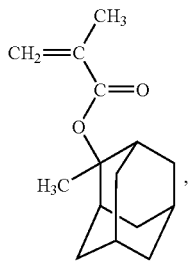

(S2-16)

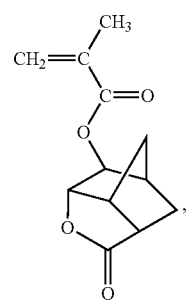

(S2-17)

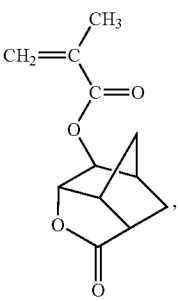

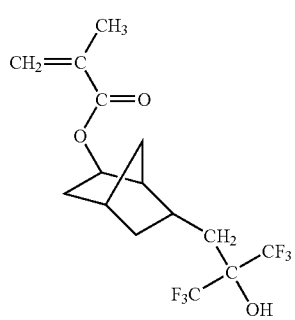
(S3-17)

33.18 g (35 mol %) of a compound (S1-17), 44.96 g (50 mol %) of a compound (S2-17), and 21.86 g (15 mol %) of a compound (S3-17) were dissolved in 200 g of toluene. A 1,000 ml three-necked flask charged with 100 g of toluene, 2.00 g of 2-hydroxyethyl 2-bromopropionate, 7.84 g of chloroindenylbis(triphenylphosphine)ruthenium, and 1.76 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (73 g, yield 73%). The resin was a copolymer with a Mw of 8,000, Mw/Mn ratio of 1.46, and a ratio of the recurring units of the compound (S1-17), the compound (S2-17), and the compound (S3-17) of 33.8:51.1: 15.1 (mol %). This resin is referred to as "resin (A-17)".

Synthesis Example 18

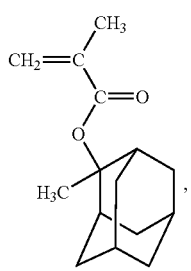
(S1-18)

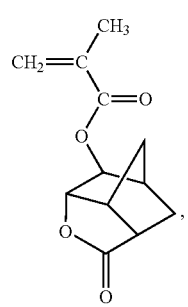
(S2-18)

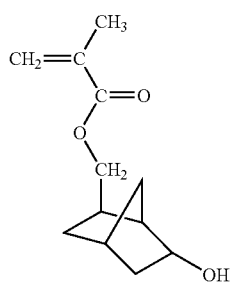
(S3-18)

36.50 g (35 mol %) of a compound (S1-18), 49.46 g (50 mol %) of a compound (S2-18), and 14.04 g (15 mol %) of a compound (S3-18) were dissolved in 200 g of toluene. A 1,000 ml three-necked flask charged with 100 g of toluene, 2.20 g of 2-hydroxyethyl 2-bromopropionate, 8.62 g of chloroindenylbis(triphenylphosphine)ruthenium, and 1.93 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (74 g, yield 74%). The resin was a copolymer with a Mw of 7700, a Mw/Mn ratio of 1.45, and a ratio of the recurring units of the compound (S1-18), the compound (S2-18), and the compound (S3-18) of 33.9:51.0: 15.1 (mol %). This resin is called "resin (A-18)".

Synthesis Example 19

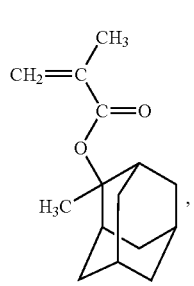
(S1-19)

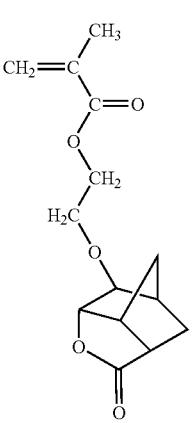
(S2-19)

(S3-19)

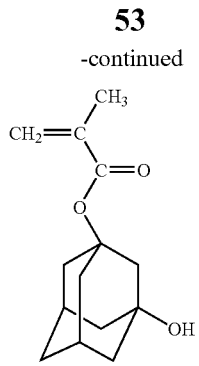

(S3-20)

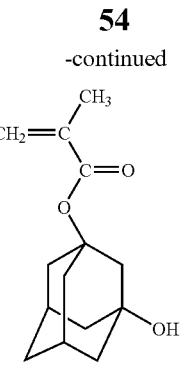

32.73 g (35 mol %) of a compound (S1-19), 53.13 g (50 mol %) of a compound (S2-19), and 14.14 g (15 mol %) of a compound (S3-19) were dissolved in 200 g of toluene. A 1,000 ml three-necked flask charged with 100 g of toluene, 1.97 g of 2-hydroxyethyl 2-bromopropionate, 7.73 g of chloroindenylbis(triphenylphosphine)ruthenium, and 1.73 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (70 g, yield 70%). The resin was a copolymer with a Mw of 8200, Mw/Mn ratio of 1.46, and a ratio of the recurring units of the compound (S1-19), the compound (S2-19), and the compound (S3-19) of 34.4:50.6:15.0 (mol %). This resin is referred to as "resin (A-19)".

Synthesis Example 20

30.99 g (35 mol %) of a compound (S1-20), 55.61 g (50 mol %) of a compound (S2-20), and 13.40 g (15 mol %) of a compound (S3-20) were dissolved in 200 g of toluene. A 1,000 ml three-necked flask charged with 100 g of toluene, 1.87 g of 2-hydroxyethyl 2-bromopropionate, 7.32 g of chloroindenylbis(triphenylphosphine)ruthenium, and 1.64 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (70 g, yield 70%). The resin was a copolymer with a Mw of 8300, Mw/Mn ratio of 1.47, and a ratio of the recurring units of the compound (S1-20), the compound (S2-20), and the compound (S3-20) of 34.5:50.5:15.0 (mol %). This resin is referred to as "resin (A-20)".

Synthesis Example 21

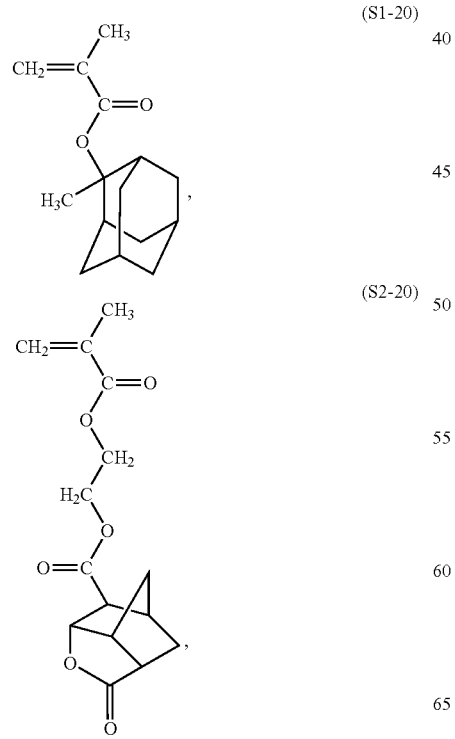

(S1-20)

(S2-20)

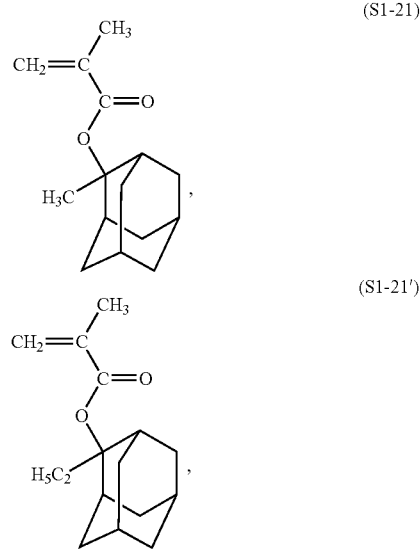

(S1-21)

(S1-21')

-continued (S2-21)
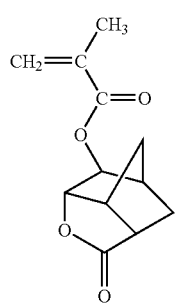

(S2-22)
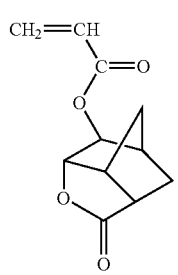

35.60 g (35 mol %) of a compound (S1-21), 16.17 g (15 mol %) of a compound (S1-21'), and 48.23 g (50 mol %) of a compound (S2-21) were dissolved in 200 g of toluene. A 1,000 ml three-necked flask charged with 100 g of toluene, 2.15 g of 2-hydroxyethyl 2-bromopropionate, 8.41 g of chloroindenylbis(triphenylphosphine)ruthenium, and 1.88 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (72 g, yield 72%). The resin was a copolymer with a Mw of 8300, Mw/Mn ratio of 1.46, and a ratio of the recurring units of the compound (S1-21), the compound (S1-21'), and the compound (S2-21) of 35.0:14.3:50.7 (mol %). This resin is referred to as "resin (A-21)".

Synthesis Example 22

37.07 g (35 mol %) of a compound (S1-22), 15.89 g (15 mol %) of a compound (S1-22'), and 47.05 g (50 mol %) of a compound (S2-22) were dissolved in 200 g of toluene. A 1,000 ml three-necked flask charged with 100 g of toluene, 2.23 g of 2-hydroxyethyl 2-bromopropionate, 8.76 g of chloroindenylbis(triphenylphosphine)ruthenium, and 1.96 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (71 g, yield 71%). The resin was a copolymer with a Mw of 8300, Mw/Mn ratio of 1.49, and a ratio of the recurring units of the compound (S1-22), the compound (S1-22'), and the compound (S2-22) of 34.8:14.8:50.4 (mol %). This resin is referred to as "resin (A-22)".

Synthesis Example 23

(S1-22)
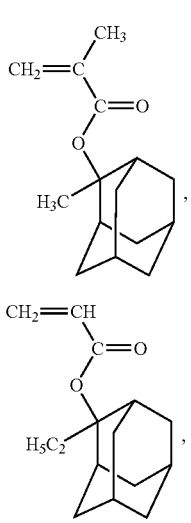

(S1-22')

(S1-23)
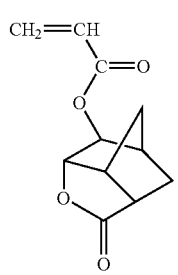

(S2-23)
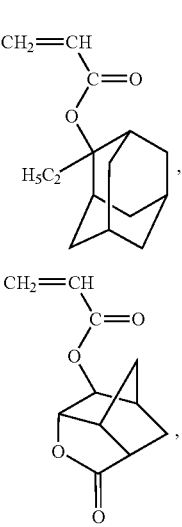

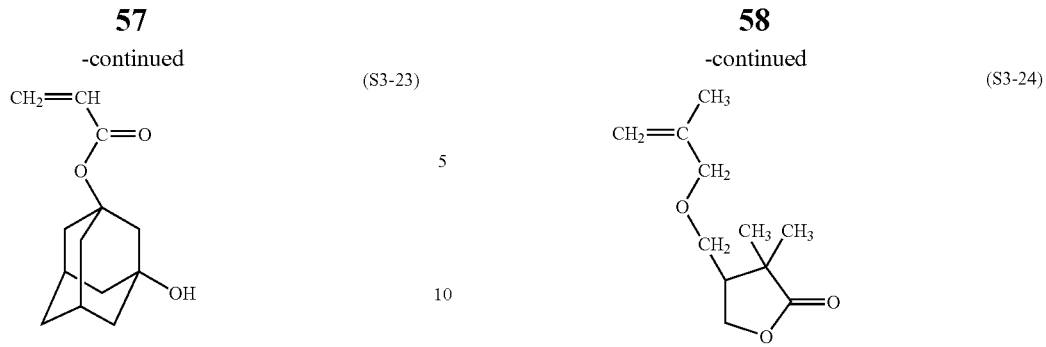

37.32 g (35 mol %) of a compound (S1-23), 47.37 g (50 mol %) of a compound (S2-23), and 15.31 g (15 mol %) of a compound (S3-23) were dissolved in 200 g of toluene. A 1,000 ml three-necked flask charged with 100 g of toluene and 2.50 g of ethyl 2-dimethylthiocarbamoylsulfanylpropionate was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (75 g, yield 75%). The resin was a copolymer with a Mw of 7700, Mw/Mn ratio of 1.26, and a ratio of the recurring units of the compound (S1-23), the compound (S2-23), and the compound (S3-23) of 34.5:50.4:15.1 (mol %). This resin is referred to as "resin (A-23)".

Synthesis Example 24

36.46 g (35 mol %) of a compound (S1-24), 49.39 g (50 mol %) of a compound (S2-24), and 14.15 g (15 mol %) of a compound (S3-24) were dissolved in 200 g of toluene. A 1,000 ml three-necked flask charged with 100 g of toluene, 2.20 g of 2-hydroxyethyl 2-bromopropionate, 8.61 g of chloroindenylbis(triphenylphosphine)ruthenium, and 1.93 g of pentamethyldiethylenetriamine was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (74 g, yield 74%). The resin was a copolymer with a Mw of 7900, Mw/Mn ratio of 1.45, and a ratio of the recurring units of the compound (S1-24), the compound (S2-24), and the compound (S3-24) of 34.1:51.0:14.9 (mol %). This resin is referred to as "resin (A-24)".

Synthesis Example 25

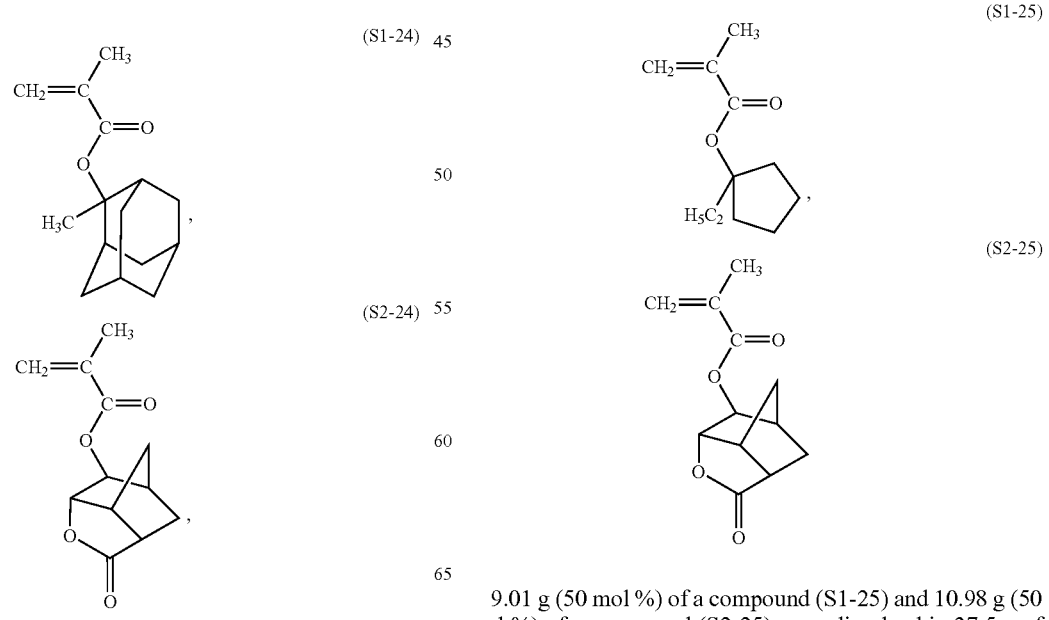

9.01 g (50 mol %) of a compound (S1-25) and 10.98 g (50 mol %) of a compound (S2-25) were dissolved in 37.5 g of 2-butanone to prepare a monomer solution (1). 0.844 g of dimethyl 2,2'-azobis(2-methylpropionate) was dissolved in 16.0 g of 2-butanone to prepare a monomer solution (2). 5.75 g of the monomer solution (1) and 1.05 g of the monomer solution (2) were added to a 300 ml three-necked flask charged with 0.704 g of methyl cyanodimethylpyrazole-1-dithiocarboxylate and 3.8 g of 2-butanone, followed by nitrogen purge by vacuum replacement. After nitrogen purge, the flask was heated to 80° C. while stirring. After 15 minutes, 51.79 g of the monomer solution (1) and 6.16 g of the monomer solution (2) were added dropwise using a fluid charge pump over three hours. Mw, Mw/Mn, and the conversion rate to polymer were determined at one, two, and three hours after initiation of dropping.

After completing the dropping, the mixture was stirred for four hours. Mw, Mw/Mn, and the conversion rate to polymer were determined at two and four hours after initiation of stirring.

After polymerization, the polymer solution was allowed to cool to 30° C. or less. 2.277 g dimethyl 2,2'-azobis(2-methylpropionate) was added to the polymerization solution and the mixture was heated to 80° C., followed by stirring for three hours to effect the terminal processing. After the terminal processing, Mw, Mw/Mn, and the conversion rate to polymer were determined.

After the reaction, the solution was allowed to cool to 30° C. or lower and poured into 1,000 g of isopropyl alcohol. White precipitate produced was collected by filtration. The white powder collected by filtration was washed twice with 500 g of isopropyl alcohol in a slurry state, filtered again, and dried for 17 hours at 60° C. to obtain a polymer (A-25) in the form of a white powder (17 g, yield 85%). The reaction results are shown in Table 1.

TABLE 1

|  | Elapsed time | Mw | Mw/Mn | Conversion rate into polymer (%) |
| --- | --- | --- | --- | --- |
| Dropping | 1 h | 1895 | 1.30 | 27.2 |
|  | 2 h | 2776 | 1.33 | 45.5 |
|  | 3 h | 3774 | 1.33 | 58.7 |
| Stirring | 2 h | 4856 | 1.34 | 75.3 |
|  | 4 h | 5618 | 1.37 | 81.8 |
| Terminal processing | 3 h | 6190 | 1.42 | 83.1 |

Synthesis Example 26

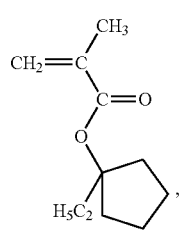
(S1-26)

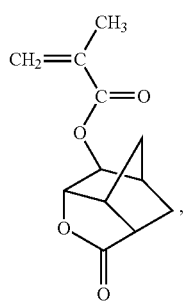
(S2-26)

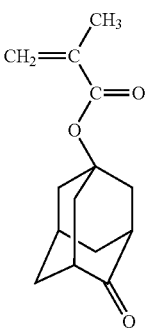
(S3-26)

7.07 g (40 mol %) of a compound (S1-26), 10.78 g (50 mol %) of a compound (S2-26), and 2.13 g (10 mol %) of a compound (S3-26) were dissolved in 37.5 g of 2-butanone to prepare a monomer solution (1). 0.844 g of dimethyl 2,2'-azobis(2-methylpropionate) was dissolved in 16.0 g of 2-butanone to prepare a monomer solution (2). 5.75 g of the monomer solution (1) and 1.05 g of the monomer solution (2) were added to a 300 ml three-necked flask charged with 0.704 g of methyl cyanodimethylpyrazole-1-dithiocarboxylate and 3.8 g of 2-butanone, followed by nitrogen purge by vacuum replacement. After nitrogen purge, the flask was heated to 80° C. while stirring. After 15 minutes, 51.79 g of the monomer solution (1) and 6.16 g of the monomer solution (2) were added dropwise using a fluid charge pump over three hours. Mw, Mw/Mn, and the conversion rate to polymer were determined at one, two, and three hours after initiation of dropping.

After completing the dropping, the mixture was stirred for four hours. Mw, Mw/Mn, and the conversion rate to polymer were determined at two and four hours after initiation of stirring.

After polymerization, the polymer solution was allowed to cool to 30° C. or less. 2.23 g dimethyl 2,2'-azobis(2-methylpropionate) was added to the polymerization solution and the mixture was heated to 80° C., followed by stirring for three hours to effect the terminal processing. After the terminal processing, Mw, Mw/Mn, and the conversion rate to polymer were determined.

After the reaction, the solution was allowed to cool to 30° C. or lower and poured into 1,000 g of isopropyl alcohol. White precipitate produced was collected by filtration. The white powder collected by filtration was washed twice with 500 g of isopropyl alcohol in a slurry state, filtered again, and dried for 17 hours at 60° C. to obtain a polymer (A-26) in the form of a white powder (16 g, yield 80%). The reaction results are shown in Table 2.

TABLE 2

| | Elapsed time | Mw | Mw/Mn | Conversion rate into polymer (%) |
|---|---|---|---|---|
| Dropping | 1 h | 2059 | 1.33 | 26.0 |
| | 2 h | 3063 | 1.36 | 47.3 |
| | 3 h | 4173 | 1.31 | 59.9 |
| Stirring | 2 h | 5098 | 1.38 | 76.8 |
| | 4 h | 5739 | 1.40 | 85.9 |
| Terminal processing | 3 h | 6279 | 1.41 | 84.5 |

Comparative Synthesis Example 1

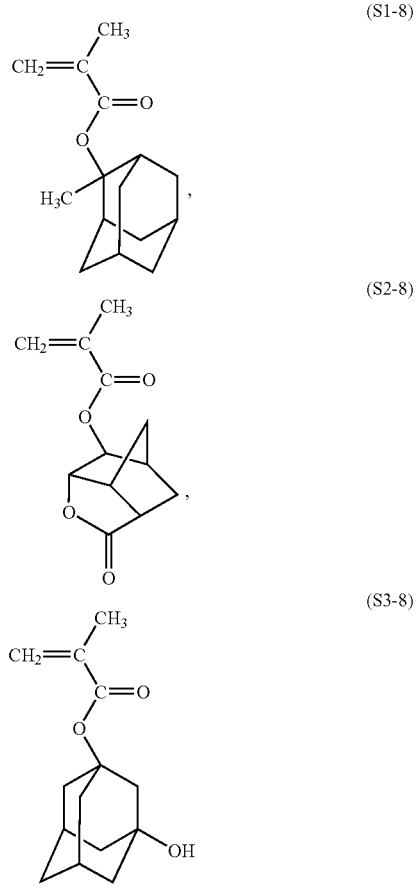

In the same manner as in Synthetic Example 8, 35.88 g (35 mol %) of the compound (S1-8), 48.61 g (50 mol %) of the compound (S2-8), and 15.51 g (15 mol %) of the compound (S3-8) were dissolved in 200 g of toluene. A 1,000 ml three-necked flask charged with 100 g of toluene and azobisisobutyronitrile was purged with nitrogen for 30 minutes. After nitrogen purge, the flask was heated to 110° C. while stirring and the above monomer solution was added dropwise using a dropping funnel over three hours. The polymerization reaction was carried out for 48 hours after initiation of dropping. After completion of polymerization, the polymer solution was cooled with water to 30° C. or lower and poured into 2,000 g of methanol. White precipitate produced was collected by filtration. The white powder collected by filtration was washed twice with 400 g of methanol in a slurry state, filtered again, and dried for 17 hours at 50° C. to obtain a white resin powder (70 g, yield 70%). The resin was a copolymer with a Mw of 9,500, Mw/Mn ratio of 2.20, and a ratio of the recurring units of the compound (S1-8), the compound (S2-8), and the compound (S3-8) of 33.2:52.1:14.7 (mol %). This resin is referred to as "resin (AC-1)".

Examples 1-26, Comparative Example 1

Radiation-sensitive resin composition solutions were prepared by mixing polymers obtained in Synthesis Examples 1-26 and Comparative Synthesis Example 1, acid generators, and other components in proportions shown in Table 3. The resulting radiation-sensitive resin composition solutions were evaluated. The evaluation results are shown in Table 4. In the examples, "part" refers to "part by weight" unless otherwise indicated.

Acid Generator (B)
  (B-1): Triphenylsulfonium nonafluoro-n-butanesulfonate
Acid Diffusion Controller (C)
  (C-1): Triethanolamine
Solvent (D)
  (D-1): Propylene glycol monomethyl ether acetate
  (D-2): Cyclohexanone

TABLE 3

| | Resin | Amount of resin | B-1 | C-1 | D-1 | D-2 |
|---|---|---|---|---|---|---|
| Example | | | | | | |
| 1 | A-1 | 100 | 3 | 0.2 | 450 | 150 |
| 2 | A-2 | 100 | 3 | 0.2 | 450 | 150 |
| 3 | A-3 | 100 | 3 | 0.2 | 450 | 150 |
| 4 | A-4 | 100 | 3 | 0.2 | 450 | 150 |
| 5 | A-5 | 100 | 3 | 0.2 | 450 | 150 |
| 6 | A-6 | 100 | 3 | 0.2 | 450 | 150 |
| 7 | A-7 | 100 | 3 | 0.2 | 450 | 150 |
| 8 | A-8 | 100 | 3 | 0.2 | 450 | 150 |
| 9 | A-9 | 100 | 3 | 0.2 | 450 | 150 |
| 10 | A-10 | 100 | 3 | 0.2 | 450 | 150 |
| 11 | A-11 | 100 | 3 | 0.2 | 450 | 150 |
| 12 | A-12 | 100 | 3 | 0.2 | 450 | 150 |
| 13 | A-13 | 100 | 3 | 0.2 | 450 | 150 |
| 14 | A-14 | 100 | 3 | 0.2 | 450 | 150 |
| 15 | A-15 | 100 | 3 | 0.2 | 450 | 150 |
| 16 | A-16 | 100 | 3 | 0.2 | 450 | 150 |
| 17 | A-17 | 100 | 3 | 0.2 | 450 | 150 |
| 18 | A-18 | 100 | 3 | 0.2 | 450 | 150 |
| 19 | A-19 | 100 | 3 | 0.2 | 450 | 150 |
| 20 | A-20 | 100 | 3 | 0.2 | 450 | 150 |
| 21 | A-21 | 100 | 3 | 0.2 | 450 | 150 |
| 22 | A-22 | 100 | 3 | 0.2 | 450 | 150 |
| 23 | A-23 | 100 | 3 | 0.2 | 450 | 150 |
| 24 | A-24 | 100 | 3 | 0.2 | 450 | 150 |
| 25 | A-25 | 100 | 3 | 0.2 | 450 | 150 |
| 26 | A-26 | 100 | 3 | 0.2 | 450 | 150 |
| Comparative Example | | | | | | |
| 1 | AC-1 | 100 | 3 | 0.2 | 450 | 150 | values indicated are parts by weight

TABLE 4

| | PB (° C.) | PEB (° C.) | Sensitivity (J/m$^2$) | LER (nm) | Molecular weight difference between lots(σ) |
|---|---|---|---|---|---|
| Example | | | | | |
| 1 | 110 | 110 | 25.5 | 5.6 | 58 |
| 2 | 110 | 110 | 25 | 5.1 | 45 |
| 3 | 110 | 110 | 27 | 5.9 | 187 |

TABLE 4-continued

| | PB (° C.) | PEB (° C.) | Sensitivity (J/m²) | LER (nm) | Molecular weight difference between lots(σ) |
|---|---|---|---|---|---|
| 4 | 110 | 110 | 22 | 5.9 | 115 |
| 5 | 110 | 110 | 23 | 6 | 115 |
| 6 | 110 | 110 | 21 | 5.9 | 100 |
| 7 | 130 | 130 | 20 | 5.4 | 152 |
| 8 | 130 | 130 | 24 | 5.7 | 182 |
| 9 | 130 | 120 | 22 | 5.8 | 182 |
| 10 | 110 | 110 | 26 | 6 | 207 |
| 11 | 110 | 110 | 24 | 6.1 | 152 |
| 12 | 110 | 110 | 23 | 5.4 | 58 |
| 13 | 110 | 110 | 22 | 5.5 | 182 |
| 14 | 110 | 110 | 22 | 5.9 | 115 |
| 15 | 110 | 110 | 20 | 5.8 | 115 |
| 16 | 130 | 130 | 27 | 6 | 207 |
| 17 | 130 | 130 | 25 | 5.7 | 152 |
| 18 | 130 | 130 | 27 | 5.3 | 130 |
| 19 | 130 | 130 | 22 | 5.7 | 152 |
| 20 | 130 | 130 | 25 | 5.5 | 187 |
| 21 | 130 | 130 | 23 | 6 | 152 |
| 22 | 130 | 130 | 23 | 5.4 | 207 |
| 23 | 110 | 110 | 22 | 5 | 45 |
| 24 | 130 | 130 | 25 | 6 | 115 |
| 25 | 110 | 130 | 22 | 5 | 123 |
| 26 | 110 | 130 | 25 | 6.2 | 156 |
| Comparative Example | | | | | |
| 1 | 130 | 130 | 26 | 6.7 | 305 |

INDUSTRIAL APPLICABILITY

The radiation-sensitive resin composition of the present invention has high transmittance of radiation, exhibits superior basic properties as a resist such as high sensitivity, resolution, dry etching resistance, and pattern shape, particularly has excellent solubility in resist solvents, and can reduce roughness on the pattern side walls. The resin composition is extremely useful for the manufacture of semiconductor devices which are expected to become further miniaturized in the future.

The invention claimed is:

1. A radiation sensitive resin composition comprising:
an acid-labile group-containing resin; and
a photoacid generator;
wherein the acid-labile group-containing resin is insoluble or scarcely soluble in alkali, but becomes alkali soluble by the action of an acid; and
wherein the acid-labile group-containing resin is made by polymerizing a recurring unit of the following formula (1) and at least two different recurring units selected from the group consisting of the recurring units of the following formulas (2)-(5) and (7),
wherein the resin is polymerized with a living radical polymerization initiator,
wherein the resin has a ratio of a weight average molecular weight to a number average molecular weight of less than 1.5, wherein the resin is a random copolymer of the recurring units which form the resin and wherein the content of the recurring unit (1) is 15-70 mol % of the total amount of the recurring units in the resin,

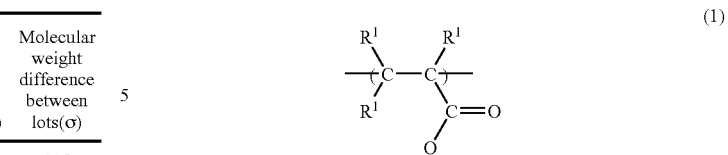

wherein $R^1$ individually represents a hydrogen atom, methyl group, trifluoromethyl group, or hydroxymethyl group and any two of $R^2$ groups form a divalent alicyclic hydrocarbon group having 4-20 carbon atoms or a derivative thereof in combination with the carbon atom to which the two $R^2$ groups bond, with the remaining $R^2$ group being a linear or branched alkyl group having 1-4 carbon atoms or a monovalent alicyclic hydrocarbon group having 4-20 carbon atoms or a derivative thereof,

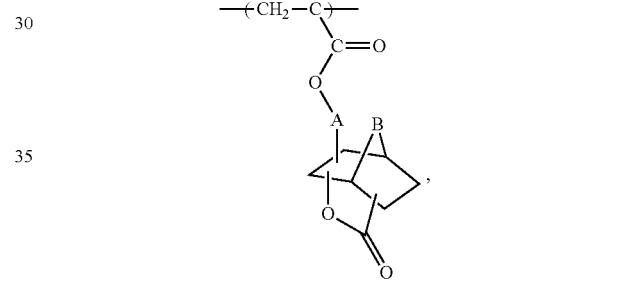

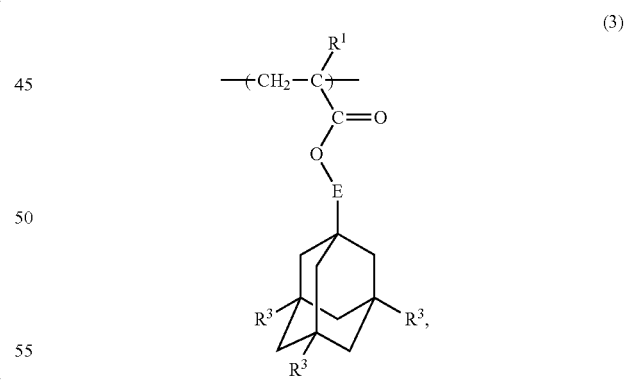

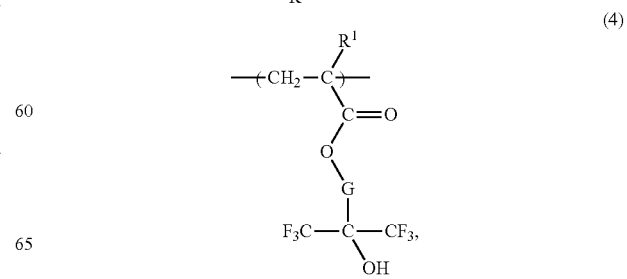

-continued

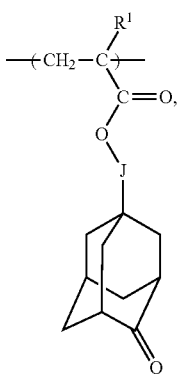
(5)

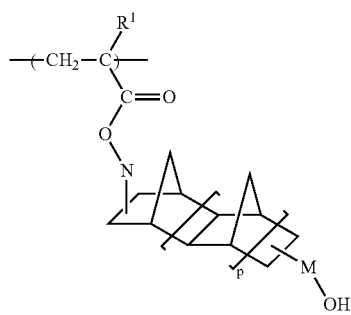
(7)

wherein A represents a single bond, a linear or branched alkylene group having 1-6 carbon atoms, a mono- or dialkylene glycol group, or an alkylene ester group, B represents a single bond, an alkylene group, an alkyloxy group which may have a substituent having 1-3 carbon atoms, or an oxygen atom, E represents a single bond or a divalent alkyl group having 1-3 carbon atoms, $R^3$ individually represents a hydroxyl group, cyano group, carboxyl group, —$COOR^5$, or —Y—$R^6$, wherein $R^5$ represents a hydrogen atom, a linear or a branched alkyl group having 1-4 carbon atoms, or an alicyclic alkyl group having 3-20 carbon atoms, Y individually represents a single bond or a divalent alkylene group having 1-3 carbon atoms, $R^6$ individually represents a hydrogen atom, hydroxyl group, cyano group, or —$COOR^7$, provided that at least one $R^3$ group is not a hydrogen atom, $R^7$ represents a hydrogen atom, a linear or branched alkyl group having 1-4 carbon atoms, or an alicyclic alkyl group having 3-20 carbon atoms, G represents a single bond, a linear or branched alkylene group having 1-6 carbon atoms, an alicyclic hydrocarbon group having 4-20 carbon atoms, an alkylene glycol group, or an alkylene ester group, J, N, and M individually represent a single bond, a substituted or unsubstituted, linear, branched, or cyclic alkylene group having 1-20 carbon atoms, an alkylene glycol group, or an alkylene ester group, and p is 0 or 1.

2. A method comprising:
depositing a composition as set forth in claim 1 onto a substrate to form a resist film;
selectively exposing the resist film to radiation to form an exposed resist film; and
developing the exposed resist film to form a resist pattern.

3. The method of claim 2, wherein the radiation is ArF excimer laser radiation.

4. The method of claim 2, further comprising heating the exposed resist film prior to developing.

5. The radiation sensitive resin composition of claim 1, wherein the acid-labile group-containing resin comprises a recurring unit of the formula (2).

6. The radiation sensitive resin composition of claim 1, wherein the living radical polymerization initiator is a mixture of a transition metal complex, an organic halide, and a Lewis acid or an amine.

7. The radiation sensitive resin composition of claim 1, wherein the living radical polymerization initiator is a compound of the following formula (8),

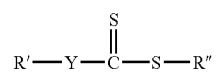
(8)

wherein R' represents an alkyl group or an aryl group having 1-15 carbon atoms which may contain an ester group, ether group, amino group, or amide group; Y represents a single bond, oxygen atom, nitrogen atom, or sulfur atom; and R" represents an alkyl group or an aryl group having 1-15 carbon atoms which may contain an ester group, ether group, or amino group.

8. The radiation sensitive resin composition of claim 1, wherein polymerization of the acid-labile group-containing resin comprises terminal processing of the living radical polymerization initiator using a heat radical generator.

9. The radiation sensitive resin composition of claim 1, wherein the photoacid generator comprises at least one compound selected from the group consisting of a triphenylsulfonium salt compound, a 4-cyclohexylphenyldiphenylsulfonium salt compound, a 4-t-butylphenyldiphenylsulfonium salt compound, and a tri(4-t-butylphenyl)sulfonium salt compound.

10. The radiation sensitive resin composition of claim 1, wherein the composition further comprises a nitrogen-containing organic compound as an acid diffusion controller.

11. The radiation sensitive resin composition of claim 1, wherein the acid-labile group-containing resin has a ratio of a weight average molecular weight to a number average molecular weight of 1.0 to 1.3.

12. The radiation sensitive resin composition of claim 1, wherein the living radical polymerization initiator is a compound of the following formula (9) or (10):

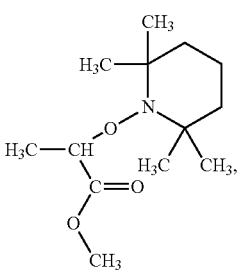
(9)

-continued

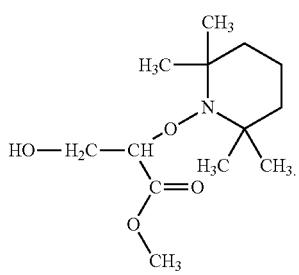

(10)

13. The radiation sensitive resin composition of claim 1, wherein the resin does not comprise recurring units other than the recurring units of the formulas (1)-(5) and (7).

14. A radiation sensitive resin composition comprising:
an acid-labile group-containing resin; and
a photoacid generator;
wherein the acid-labile group-containing resin is insoluble or scarcely soluble in alkali, but becomes alkali soluble by the action of an acid; and
wherein the acid-labile group-containing resin is made by polymerizing a recurring unit of the following formula (1) and a recurring unit of the following formula (2), and at least one recurring unit selected from the group consisting of the recurring units of the following formulas (3)-(7) to produce an acid-labile group-containing resin,
wherein the resin is polymerized with a living radical polymerization initiator,
wherein the resin has a ratio of a weight average molecular weight to a number average molecular weight of less than 1.5, wherein the resin is a random copolymer of the recurring units which form the resin and wherein the content of the recurring unit (1) is 15-70 mol % of the total amount of the recurring units in the resin,

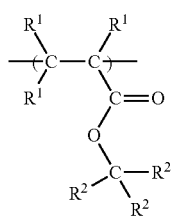

(1)

wherein $R^1$ individually represents a hydrogen atom, methyl group, trifluoromethyl group, or hydroxymethyl group and any two of $R^2$ groups form a divalent alicyclic hydrocarbon group having 4-20 carbon atoms or a derivative thereof in combination with the carbon atom to which the two $R^2$ groups bond, with the remaining $R^2$ group being a linear or branched alkyl group having 1-4 carbon atoms or a monovalent alicyclic hydrocarbon group having 4-20 carbon atoms or a derivative thereof,

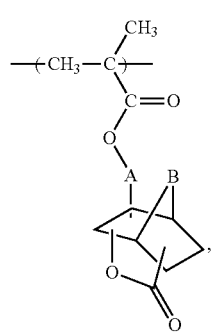

(2)

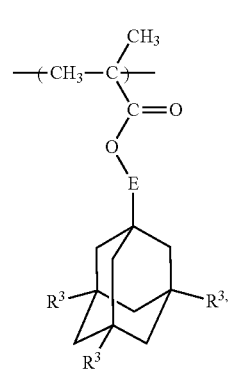

(3)

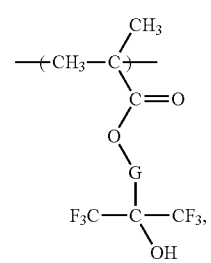

(4)

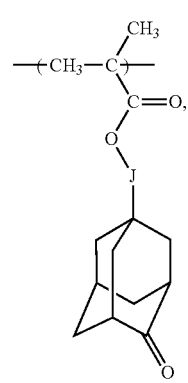

(5)

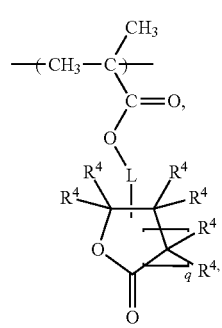

(6)

-continued

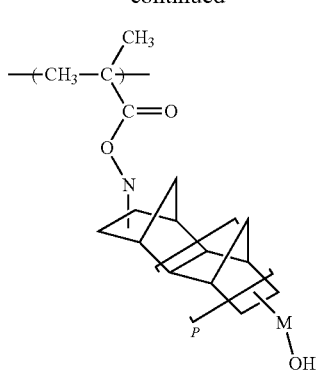
(7)

wherein A represents a single bond, a linear or branched alkylene group having 1-6 carbon atoms, a mono- or dialkylene glycol group, or an alkylene ester group, B represents a single bond, an alkylene group, an alkyloxy group which may have a substituent having 1-3 carbon atoms, or an oxygen atom, E represents a single bond or a divalent alkyl group having 1-3 carbon atoms, $R^3$ individually represents a hydroxyl group, cyano group, carboxyl group, —$COOR^5$, or —Y—$R^6$, wherein $R^5$ represents a hydrogen atom, a linear or a branched alkyl group having 1-4 carbon atoms, or an alicyclic alkyl group having 3-20 carbon atoms, Y individually represents a single bond or a divalent alkylene group having 1-3 carbon atoms, $R^6$ individually represents a hydrogen atom, hydroxyl group, cyano group, or —$COOR^7$, provided that at least one $R^3$ group is not a hydrogen atom, $R^7$ represents a hydrogen atom, a linear or branched alkyl group having 1-4 carbon atoms, or an alicyclic alkyl group having 3-20 carbon atoms, G represents a single bond, a linear or branched alkylene group having 1-6 carbon atoms, an alicyclic hydrocarbon group having 4-20 carbon atoms, an alkylene glycol group, or an alkylene ester group, J, L, N, and M individually represent a single bond, a substituted or unsubstituted, linear, branched, or cyclic alkylene group having 1-20 carbon atoms, an alkylene glycol group, or an alkylene ester group, p is 0 or 1, $R^4$ represents a hydrogen atom, a linear or branched alkyl group having 1-4 carbon atoms, an alkoxy group, a hydroxyalkyl group, or a divalent alicyclic hydrocarbon group having 3-20 carbon atoms or a derivative thereof, and q is 1 or 2.

\* \* \* \* \*